(12) United States Patent
Zhao et al.

(10) Patent No.: US 10,409,159 B2
(45) Date of Patent: Sep. 10, 2019

(54) PHOTOPATTERNABLE COMPOSITIONS, PATTERNED HIGH K THIN FILM DIELECTRICS AND RELATED DEVICES

(71) Applicant: Flexterra, Inc., Skokie, IL (US)

(72) Inventors: Wei Zhao, Skokie, IL (US); Antonio Facchetti, Chicago, IL (US); Yan Zheng, Skokie, IL (US); Andrea Stefani, Lainate (IT); Mauro Riva, Lainate (IT); Caterina Soldano, Lainate (IT); Michele Muccini, Monterotondo Stazione (IT)

(73) Assignee: Flexterra, Inc., Skokie, IL (US)

( * ) Notice: Subject to any disclaimer, the term of this patent is extended or adjusted under 35 U.S.C. 154(b) by 0 days.

(21) Appl. No.: 15/390,708

(22) Filed: Dec. 26, 2016

(65) Prior Publication Data

US 2017/0192354 A1 Jul. 6, 2017

Related U.S. Application Data

(63) Continuation of application No. PCT/US2015/038146, filed on Jun. 26, 2015.

(60) Provisional application No. 62/017,262, filed on Jun. 26, 2014.

(30) Foreign Application Priority Data

Jun. 26, 2014 (EP) .................................... 14425084

(51) Int. Cl.
| | |
|---|---|
| *G03F 7/038* | (2006.01) |
| *G03F 7/004* | (2006.01) |
| *C08F 214/22* | (2006.01) |
| *H01L 51/52* | (2006.01) |
| *H01L 51/00* | (2006.01) |
| *C09D 127/16* | (2006.01) |
| *G03F 7/16* | (2006.01) |
| *G03F 7/20* | (2006.01) |
| *G03F 7/32* | (2006.01) |
| *G03F 7/38* | (2006.01) |
| *H01L 51/05* | (2006.01) |

(52) U.S. Cl.
CPC ........ *G03F 7/0045* (2013.01); *C08F 214/222* (2013.01); *C09D 127/16* (2013.01); *G03F 7/0046* (2013.01); *G03F 7/038* (2013.01); *G03F 7/0384* (2013.01); *G03F 7/162* (2013.01); *G03F 7/2002* (2013.01); *G03F 7/32* (2013.01); *G03F 7/38* (2013.01); *H01L 51/004* (2013.01); *H01L 51/5296* (2013.01); *H01L 51/052* (2013.01); *H01L 51/0541* (2013.01); *H01L 51/0545* (2013.01)

(58) Field of Classification Search
CPC .... C08F 214/202; G03F 7/038; G03F 7/0384; H01L 51/5296
USPC .......................................... 430/282.1, 286.1
See application file for complete search history.

(56) References Cited

U.S. PATENT DOCUMENTS

| | | | |
|---|---|---|---|
| 2004/0234885 A1* | 11/2004 | Watanabe | G03F 7/0045 430/141 |
| 2007/0166838 A1* | 7/2007 | Marsman | H01L 21/0212 438/3 |
| 2010/0201227 A1 | 8/2010 | Choi et al. | 310/363 |
| 2013/0020643 A1* | 1/2013 | Price | H01L 27/1214 257/347 |

FOREIGN PATENT DOCUMENTS

| | | |
|---|---|---|
| EP | 0208314 A2 | 1/1987 |
| EP | 1589046 A1 | 10/2005 |
| EP | 1634895 A1 | 3/2006 |
| WO | 2013/087500 | 6/2013 |

OTHER PUBLICATIONS

Tan et al., "Synthesis of fluoropolymer containing tunable unsaturation by a controlled dehydrochlorination of P(VDF-*co*-CTFE) and its curing for high performance rubber applications," J. Mater. Chem. 22: 18496-18504, 2012.

* cited by examiner

*Primary Examiner* — Daborah Chacko-Davis
(74) *Attorney, Agent, or Firm* — McDonnell Boehnen Hulbert & Berghoff LLP

(57) ABSTRACT

The present teachings relate to a photopatternable composition including a vinylidene fluoride-based polymer, a photosensitive non-nucleophilic base, and a crosslinking agent. The photopatternable composition can be used to prepare a patterned thin film component for use in an electronic, optical, or optoelectronic device such as an organic thin film transistor. The patterned thin film component can be used as a gate dielectric with a high dielectric constant, for example, a dielectric constant greater than 10.

24 Claims, 11 Drawing Sheets a)

b)

a)

b)

a)

b)

c)

a)

b)

c)

d)

a)

b)

c)

PHOTOPATTERNABLE COMPOSITIONS, PATTERNED HIGH K THIN FILM DIELECTRICS AND RELATED DEVICES

CROSS-REFERENCE TO RELATED APPLICATIONS

This is a continuation of International Application No. PCT/US15/38146 filed on Jun. 26, 2015, which claims priority to and the benefit of the filing dates of U.S. Provisional Patent Application Ser. No. 62/017,262 filed on Jun. 26, 2014, and European Patent Application Serial No. 14425084.2 filed on Jun. 26, 2014, the entire disclosure of each of which is incorporated by reference herein for all purposes.

BACKGROUND

There has been a growing interest in the investigation of high-k dielectric materials for reducing the operating voltages required for new flexible/printed electronics technologies. For example, in the case of organic field effect transistors (OFETs), while devices based upon conventional $SiO_2$ dielectrics (k≈4, dielectric thickness ~200-300 nm) typically operate at voltages between |30|-|50| V, and devices based upon conventional organic dielectrics (k<10) typically operate at voltages between |50|-|100| V, recent research has shown that OFETs with a high-k (e.g., k>10) gate dielectric can operate at much lower voltages (≤|40| V).

Various metal oxides with high dielectric constants have been investigated as an alternative to $SiO_2$ gate dielectrics in OFETs. However, most of these metal oxides are based on ceramics, which require generally expensive deposition equipment and high-temperature annealing processes. Furthermore, these films can crack upon multiple bending because of their poor mechanical properties. Polymeric dielectrics offer good processability, but conventional dielectric polymers typically have low dielectric constants. Nevertheless, there are a few classes of polymers that are known to be high-k (k>10) polymers. One such class of polymers is poly(vinylidene fluoride) (PVDF) and its copolymers. Specifically, the dielectric constants of state-of-the-art PVDF-based polymers (e.g., poly(vinylidene fluoride-trifluoroethylene), P(VDF-TrFE); poly(vinylidene fluoride-trifluoroethylene-chlorofluoroethylene), P(VDF-TrFE-CFE); and poly(vinylidene fluoride-tetrafluoroethylene-hexafluoropropylene), P(VDF-TFE-HFP)) have been reported to be 20 or higher, and in some cases, 40 or higher, depending on the comonomers, backbone regiochemistry, and the ratio of the different repeating units. Their applicability in low-voltage devices has been confirmed by incorporating such PVDF-based polymers as gate dielectrics in OFETs.

To improve the electronic and mechanical properties of polymeric dielectrics and to integrate them into conventional device fabrication processes, it is desirable that these polymers can be crosslinked to achieve far more robust films. Even more desirable is if these polymers or their composite can be photocrosslinked (instead of crosslinked thermally or chemically), such that they can be photopatterned (i.e., patterned via photolithography) directly into patterned gate dielectrics without using a photoresist layer. For example, while peroxide/co-agent systems have been used to crosslink fluoropolymers, peroxide-based curing systems require thermal activation, and given that heat cannot be easily confined, peroxides and other heat-activated curing systems are not useful for patterning thin films where good resolution is critical. In addition, to be peroxide-curable, the fluoropolymer typically needs to incorporate a bromine- or iodine-containing monomer. Further, crosslinking reactions involving peroxides are known to form unwanted ionic species as side products, which if remained in the crosslinked network, will cause leakage current-related problems (breakdown, current-voltage hysteresis, bias stress) and thus are detrimental to the performance of electronic devices.

Past approaches of making PVDF-based polymers photocrosslinkable have focused mainly on incorporating a photocrosslinkable repeating unit into the polymer and/or the addition of bis-azides (e.g., 2,6-bis(4-azidebenzylidene)-4-methylcyclohexanone and other analogous compounds) as a photosensitive crosslinker in the polymer spin-coat solution. See e.g., International Publication Nos. WO2005064705, WO2013087500, and WO2013/087501, and US Patent Publication No. US20070166838.

Accordingly, there is a desire in the art to develop new methods of conferring photocrosslinkability to PVDF-based polymers and to provide photopatternable compositions including PVDF-based polymers, particularly, whereby thin films prepared from such compositions can be effectively photocrosslinked to withstand development with various organic solvents to provide patterned thin film components with high-k properties.

SUMMARY

In light of the foregoing, the present teachings relate to methods for preparing a patterned thin film component from a photopatternable composition that includes a vinylidene fluoride-based polymer, a photosensitive non-nucleophilic base, and a crosslinking agent. The present teachings also relate to various electronic, optical, and optoelectronic devices (including organic thin film transistors such as organic field-effect transistors and organic light-emitting transistors) including a gate dielectric component composed of a patterned thin film prepared from the photopatternable composition.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
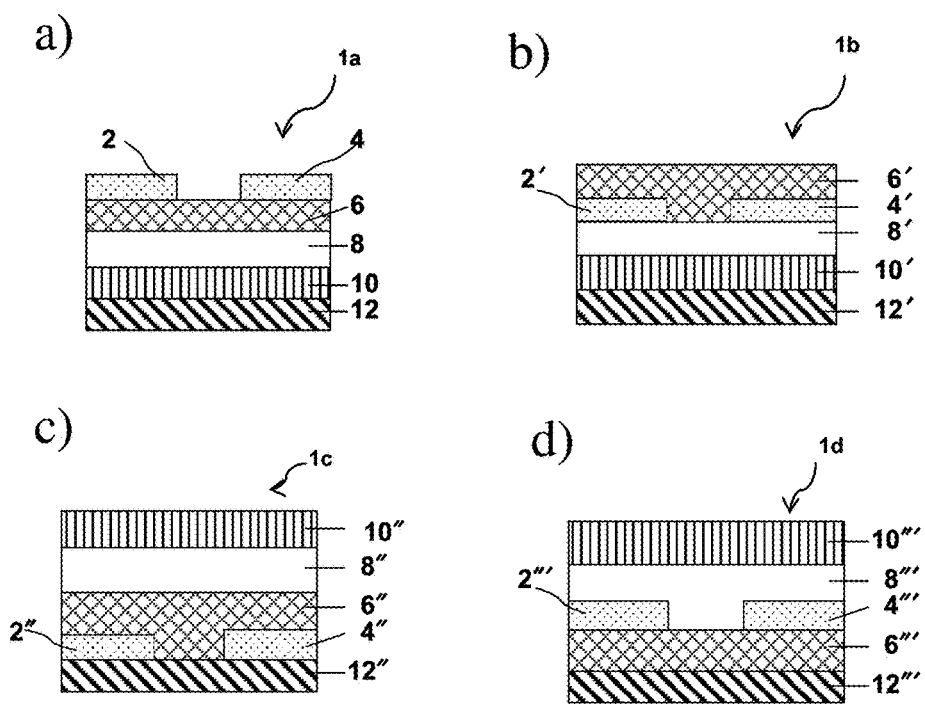
FIG. 1 shows exemplary organic field-effect transistors (OFETs) having, respectively, a bottom-gate top-contact (a), a bottom-gate bottom-contact structure (b), a top-gate bottom-contact structure (c), and a top-gate top-contact structure (d).

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "halo" or "halogen" refers to fluoro, chloro, bromo, and iodo.

As used herein, "alkyl" refers to a straight-chain, branched, or cyclic saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, cyclopropyl groups, cyclohexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., CF$_3$ and C$_2$F$_5$), are included within the definition of "haloalkyl." For example, a C$_{1-40}$ haloalkyl group can have the formula —C$_s$H$_{2s+1-t}$X$^0_t$, where X$^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxy, hexoxy groups, and the like. The alkyl group in the —O-alkyl group can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 22 carbon atoms in its ring system (e.g., C$_{6-14}$ aryl group), which can include multiple fused rings. In some embodiments, a polycyclic aryl group can have from 8 to 22 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic) and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —C$_6$F$_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—C$_{6-14}$ aryl group, where Y is as defined herein. An example of an arylalkyl group is a benzyl group (—CH$_2$—C$_6$H$_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 22 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

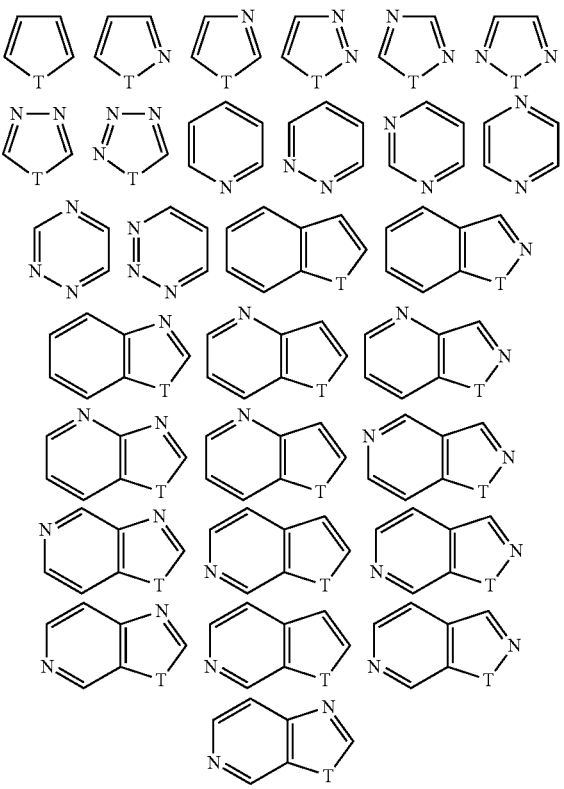

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

Throughout the specification, structures may or may not be presented with chemical names. Where any question arises as to nomenclature, the structure prevails.

In one aspect, the present teachings relate to a photopatternable composition comprising a vinylidene fluoride-based polymer (a PVDF-based polymer), a photosensitive non-nucleophilic base, and a crosslinking agent. The foregoing components generally do not react chemically with one another without irradiation. However, upon photoexposure, the photosensitive non-nucleophilic base causes deprotonation and eventually double bond generation in the polymer backbone (via dehydrohalogenation). The crosslinking agent then proceeds to crosslink the polymer by reacting with the newly generated double bonds.

In various embodiments, the vinylidene fluoride-based polymer can include vinylidene fluoride as a first repeating unit and at least a second repeating unit selected from the group consisting of vinyl fluoride, trifluoroethylene, tetrafluoroethylene, bromotrifluoroethylene, chlorofluoroethylene, chlorotrifluoroethylene, vinylidene chloride, and hexafluoropropylene. In certain embodiments, the vinylidene fluoride-based polymer further includes a third repeating unit selected from the group consisting of vinyl fluoride, trifluoroethylene, tetrafluoroethylene, bromotrifluoroethylene, chlorofluoroethylene, chlorotrifluoroethylene, vinylidene chloride, and hexafluoropropylene, where the third repeating unit is different from the second repeating unit. In particular embodiments, the vinylidene fluoride-based polymer can include vinylidene fluoride as a first repeating unit, a second repeating unit selected from the group consisting of vinyl fluoride, trifluoroethylene, and hexafluoropropylene, and an optionally third repeating unit different from the second repeating unit that is selected from the group consisting of vinyl fluoride, trifluoroethylene, and hexafluoropropylene, chlorofluoroethylene, chlorotrifluoroethylene, and vinylidene chloride. The foregoing vinylidene fluoride-based polymers typically have a high dielectric constant (k). For example, various embodiments of the vinylidene fluoride-based polymer can have a dielectric constant greater than about 10, preferably greater than about 15, and more preferably, greater than about 20.

In certain embodiments, the vinylidene fluoride-based polymer can be a copolymer of vinylidene fluoride and trifluoroethylene (P(VDF-TrFE)), a copolymer of vinylidene fluoride and chlorotrifluoroethylene (P(VDF-CTFE)), or a copolymer of vinylidene fluoride and hexafluoropropylene (P(VDF-HFP)). In other embodiments, the vinylidene fluoride-based polymer can be a terpolymer including vinylidene fluoride as a first repeating unit, trifluoroethylene as a second repeating unit, and a third repeating unit selected from the group consisting of vinyl fluoride, tetrafluoroethylene, hexafluoropropylene, chlorofluoroethylene, chlorotrifluoroethylene, and vinylidene chloride. For example, the vinylidene fluoride-based polymer can be a terpolymer selected from the group consisting of poly(vinylidene fluoride-trifluoroethylene-chlorotrifluoroethylene), poly(vinylidene fluoride-trifluoroethylene-chlorofluoroethylene), poly(vinylidene fluoride-trifluoroethylene-hexafluoropropylene), poly(vinylidene fluoride-trifluoroethylene-tetrafluoroethylene), poly(vinylidene fluoride-trifluoroethylene-vinyl fluoride), and poly(vinylidene fluoride-trifluoroethylene-vinylidene chloride). The terpolymer can be an alternating terpolymer, where the repeating units are regularly alternating; a periodic terpolymer where the repeating units are arranged in a repeating sequence; a statistical or random terpolymer; or a block terpolymer containing three or more homopolymer subunits linked by covalent bonds. In addition, the terpolymer can be linear or branched.

In some embodiments, the vinylidene fluoride-based polymer can be represented by formula (I):

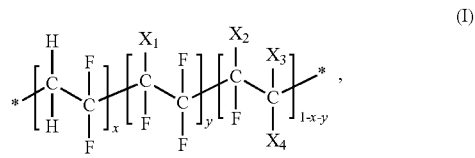

wherein $X_1$ is H or Cl;
$X_2$, $X_3$, and $X_4$ are selected from the group consisting of H, F and Cl, provided that no more than one of $X_2$, $X_3$, and $X_4$ is Cl and not all of $X_2$, $X_3$, and $X_4$ are F;
x is between about 30 mol % and about 85 mol %, y is between about 10 mol % and about 65 mol %, and x+y≤100 mol %.

In some embodiments, polymers of formula (I) have only two units, hence the sum of x and y is 100 mol %. In such embodiments, $X_1$ can be, for example, H or Cl. In other embodiments, the sum of x and y can be no more than 99 mol %, preferably no more than 97 mol %, and more preferably no more than 90 mol %. For example, the sum of x and y can be about 90 mol %. In preferred embodiments, x can be greater than about 50 mol %. For example, x can be between about 55 mol % and about 75 mol %. In preferred embodiments, y can be between 15 mol % and about 35 mol %. In these embodiments, $X_2$, for example, can be Cl, and both $X_3$ and $X_4$ can be H or F.

The vinylidene fluoride-based polymers described herein are chemically inert. While photosensitive radical initiators have been used to photocrosslink certain vinylidene fluoride-based polymers, to the inventors' knowledge, the actual photocrosslinkers used are limited to bis-azides (specifically, 2,6-bis(4-azidebenzylidene)-4-methylcyclohexanone and other analogous compounds), and their efficiencies are quite low. Particularly, although the bis-azides can produce highly active dinitrenes upon irradiation, which can then cross-link the chains of the polymer (either by inserting into carbon-hydrogen bonds, or by abstracting hydrogen atoms from —CH$_2$— groups and leaving free radicals, which terminate by coupling reactions), it was found that the bis-azides generally do not disperse well within the polymer matrix. As a result, sufficient photocrosslinking can be achieved only either with a high crosslinker:polymer ratio (for example, at least a ratio of 1:10 or 10 wt % crosslinker) and/or by modifying the polymer to include a photocrosslinkable group (e.g., an azide-containing group).

The inventors have unexpectedly discovered that vinylidene fluoride-based polymers can be efficiently photocrosslinked by using a crosslinking system that includes a photosensitive non-nucleophilic base and a crosslinking agent that includes two or more crosslinking groups. The photosensitive non-nucleophilic base is a compound which, prior to photoexposure, is substantially chemically unreactive with the vinylidene fluoride-based polymer; however, upon photoexposure, it is capable of reacting with the vinylidene fluoride-based polymer to generate unsaturation (double bonds). Without wishing to be bound by any particular theory, the mechanism is believed to involve deprotonation and subsequently direct or indirect dehydrohalogenation (i.e., eliminating HX (e.g., HF or HCl) from the polymer backbone). The crosslinking agent can be any crosslinking agent known in the art that can react or promote the reactivity of the resulting double bonds in the vinylidene fluoride-based polymer (after reaction with the non-nucleophilic base but not the pristine polymer) to enable a cross-linked network.

It is preferred that the photosensitive non-nucleophilic base is a strong organic base, specifically, one that has an increased pKa upon photoexposure compared to its unexcited state. For example, the photosensitive non-nucleophilic base, inherently or upon photosensitization, can absorb light in a wavelength range from about 270 nm to about 420 nm, and upon such photoexposure, its pKa can increase to at least about 15, preferably greater than 20. Without wishing to be bound by any particular theory, it is believed that the pKa of the photosensitive non-nucleophilic base increases significantly upon photoexposure, and the photosensitive non-nucleophilic base extracts a proton from the vinylidene fluoride-based polymer, which is followed by elimination of a halide anion (e.g., F$^-$ or Cl$^-$) to generate unsaturation. See e.g., Wang et al., "Photophysics and excited-state proton transfer of 2'-hydroxy-2-trans-styrylquinoline," *Chemical Physics Letters*, 418: 397-401 (2006); and Favaro et al., "Excited State Reactivity of Aza Aromatics. I. Basicity of 3-Styrylpyridines in the First Excited Singlet State," *J. Phys. Chem.*, 77(5): 601-604 (1973). For example, and without wishing to be bound by any particular theory, the photosensitive non-nucleophilic base can react with vinylidene fluoride repeating units in the polymer and causes them to undergo dehydrofluorination as follows:

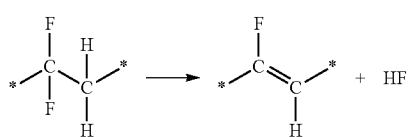

For example, the photosensitive non-nucleophilic base can be represented by one of the formulae selected from the group consisting of:

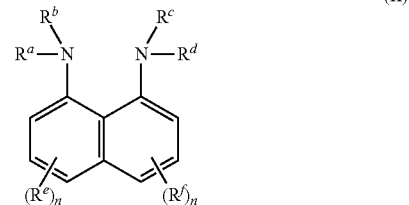

(II)

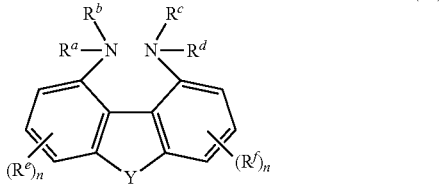

(III)

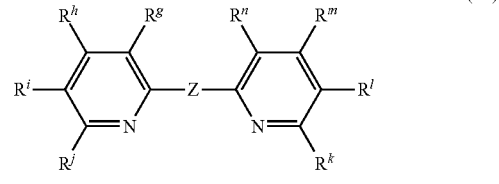

(IV)

wherein:

Y is selected from the group consisting of C=C, CR$_2$, NR, O, S, and Se, wherein R is H, a C$_{1-6}$ alkyl group, an optionally substituted phenyl group, or an optionally substituted benzyl group;

Z is selected from the group consisting of NR, an optionally substituted pyridyl group, or a covalent bond;

R$^a$, R$^b$, R$^c$, and R$^d$ independently are H, a C$_{1-6}$ alkyl group, an optionally substituted phenyl group, or an optionally substituted benzyl group, or R$^a$ and R$^b$ together and/or R$^c$ and R$^d$ together can be joined with the nitrogen atom to form a guanidinyl group, an amidinyl group, or a triaminophosphazenyl group;

R$^e$ and R$^f$ independently are a halo group, a cyano group, a nitro group, a C$_{1-6}$ alkyl group, a C$_{1-6}$ haloalkyl group, or a C$_{1-6}$ alkoxy group;

R$^g$, R$^h$, R$^i$, and R$^j$ independently are H, a halo group, a cyano group, a nitro group, a C$_{1-6}$ alkyl group, a C$_{1-6}$ haloalkyl group, or a C$_{1-6}$ alkoxy group, an optionally substituted phenyl group, or an optionally substituted benzyl group, or R$^g$ and R$^h$ together or R$^h$ and R$^i$ together or R$^i$ and R$^j$ together can be joined with the two carbon atoms therebetween to form an optionally substituted C$_{6-14}$ aryl group or an optionally substituted 5-14 membered heteroaryl group;

R$^k$, R$^l$, R$^m$, and R$^n$ independently are H, a halo group, a cyano group, a nitro group, a C$_{1-6}$ alkyl group, a C$_{1-6}$ haloalkyl group, or a C$_{1-6}$ alkoxy group, an optionally substituted phenyl group, or an optionally substituted benzyl group, or R$^k$ and R$^l$ together or R$^l$ and R$^m$ together or R$^m$ and R$^n$ together can be joined with the two carbon atoms therebetween to form an optionally substituted C$_{6-14}$ aryl group or an optionally substituted 5-14 membered heteroaryl group; or if neither R$^g$ and R$^h$ together nor R$^m$ and R$^n$ together join to form an optionally substituted C$_{6-14}$ aryl group or an optionally substituted 5-14 membered heteroaryl group, then $R^g$ and $R^n$ together can be joined with Q and the four carbon atoms therebetween to form an optionally substituted $C_{6-14}$ aryl group or an optionally substituted 5-14 membered heteroaryl group; and n is 0, 1, 2 or 3.

Referring to the embodiments represented by formulae (II), (III), and (IV), it can be seen that the nucleophilicity of the nitrogen atoms is significantly reduced due to steric hindrance, such that while protons can coordinate to the nitrogen basic centers, alkylation and other nucleophilic reactions are inhibited. Protonation of compounds of formulae (II), (III), and (IV) can be illustrated as:

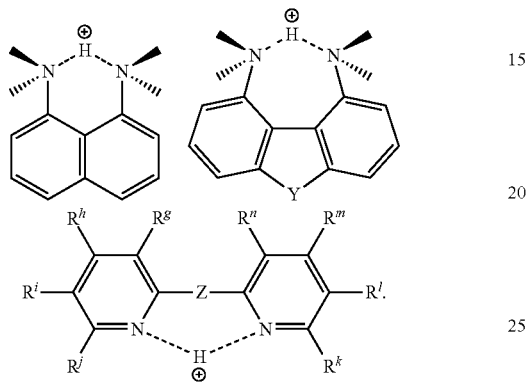

Accordingly, other bulky aromatic bases with similarly oriented amine groups can be used as the photosensitive non-nucleophilic base according to the present teachings, including without limitation pyridine-based compounds such as those including a pyridine coupled with an amine group or a nitrogen-containing heteroaryl group. Illustrative examples include:

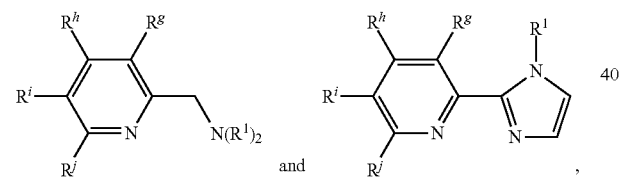

wherein $R^l$, $R^g$, $R^h$, $R^i$, and $R^j$ are as defined herein.

In certain embodiments, the photosensitive non-nucleophilic base can be represented by one of the formulae selected from the group consisting of:

(IIa)

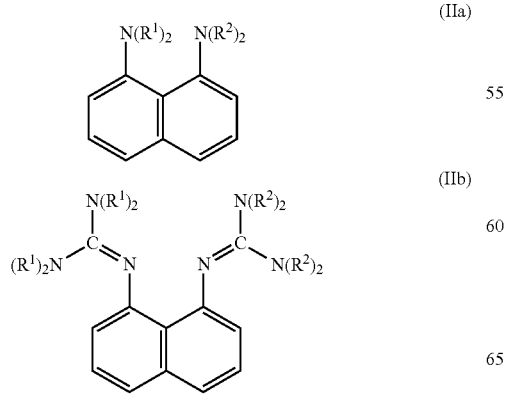

(IIb)

(IIc)

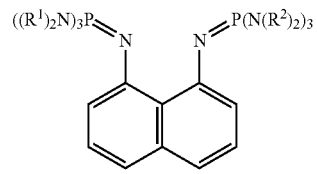

(IIIa)

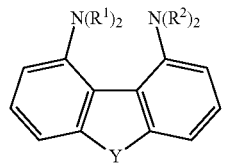

(IIIb)

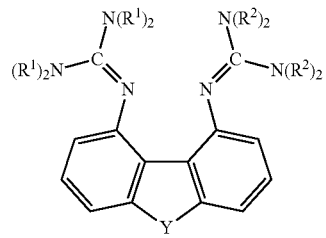

(IIIc)

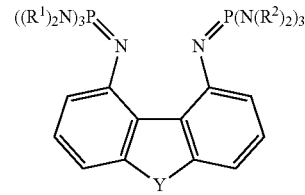

(IVa)

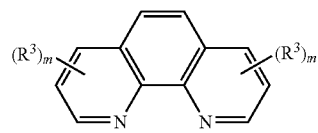

(IVb)

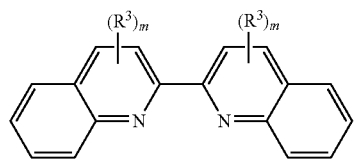

(IVc)

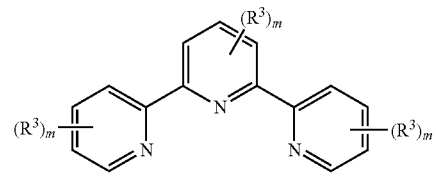

wherein each $R^1$ and $R^2$ independently is H or a $C_{1-6}$ alkyl group; each $R^3$ independently is a $C_{1-6}$ alkyl group or an optionally substituted benzyl group; and m is 0, 1, or 2.

In particular embodiments, the photosensitive non-nucleophilic base can be selected from the group consisting of:

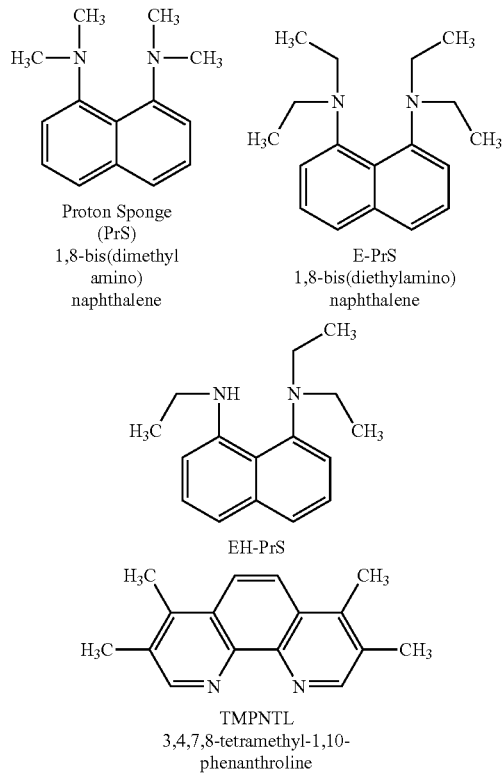

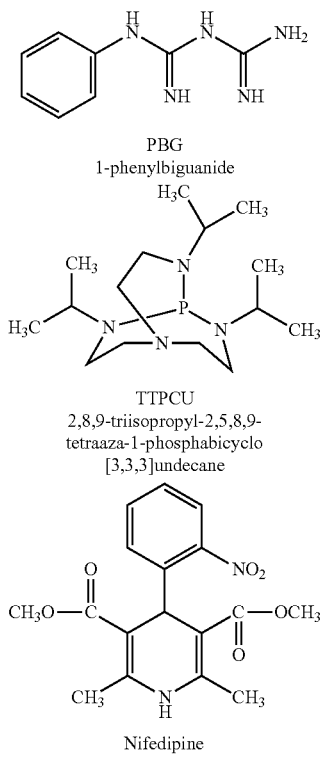

In other embodiments, the photosensitive non-nucleophilic base can be a photosensitive base generator. Examples of photosensitive base generators include oxime esters, benzyl carbamates (e.g. amines protected by a benzyloxycarbonyl substituent), benzoin carbamates, O-carbamoylhydroxyamines, O-carbamoyloximes, aryl (e.g., benzyl) sulfonamides, N-arylformamides, imines, and nifedipine and its derivatives. Other photosensitive base generators suitable for use in the present invention will be known to those skilled in the art such as those disclosed in "Base Catalysis in Imaging Materials," by J. Frechet et al. J. Org. Chem. 1990, 55, 5919; "Acid Hardening Positive Photoresist Using Photochemical Generation of Base" by Winkle et al. J. of Photopolymer Sci. and Tech. 3, 1990, 419, and "Synthetic Organic Photochemistry" by Horspool, Springer, 1984, the disclosure of each of which is incorporated herein by reference. Preferred photobase generators include bis[(2,6-dinitrobenzyl) oxycarbonyl]hexane-1,6-diamine, N-(2-nitrobenzyloxycarbonyl)-cyclohexylamine, N-[[(2-nitrophenyl)-1-methylmethoxy]carbonyl]decylamine, N-[[1-(3,5-dimethoxyphenyl)-1-methyl-ethoxy]-carbonyl] cyclohexylamine or the corresponding bis-carbamate of 1,6-diaminohexane, 1,1-bis(4-dimethylaminophenyl)-1-phenyl-methanol and analogous substituted triphenyl methanol. The photosensitive base generator can absorb light in the 270-420 nm region to generate the base. Specific examples include:

The crosslinking agent can be selected from various compounds known by those skilled in the art to be reactive with double bonds. For example, the crosslinking agent can be a small molecule or a polymer having one or more thiol groups that can react with the double bonds present in the dehydrohalogenated polymer via thiol-ene click chemistry. In some embodiments, the crosslinking agent can be a small molecule or a polymer having one or more amine groups that can react with the double bonds present in the dehydrohalogenated polymer via hydroamination. In other embodiments, the crosslinking agent can be a small molecule or a polymer having one or more maleimide groups that can react with the double bonds present in the dehydrohalogenated polymer via, for example, conjugate addition. In yet other embodiments, the crosslinker can be a small molecule or a polymer that can promote a [2+2] or a [2+4] cycloaddition; for example, such small molecule or polymer can have one or more vinyl groups. In preferred embodiments, the crosslinking agent should not have any significant absorption in the 270-420 nm region so that it does not compete with the photosensitive non-nucleophilic base. In addition, the crosslinking agent preferably is not thermally activated and is not peroxide-based. Specific examples of such mercapto-, amino-, vinyl or maleimido-functionalized crosslinkers include:

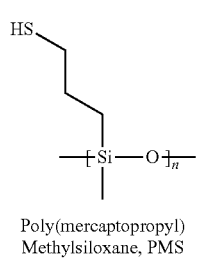

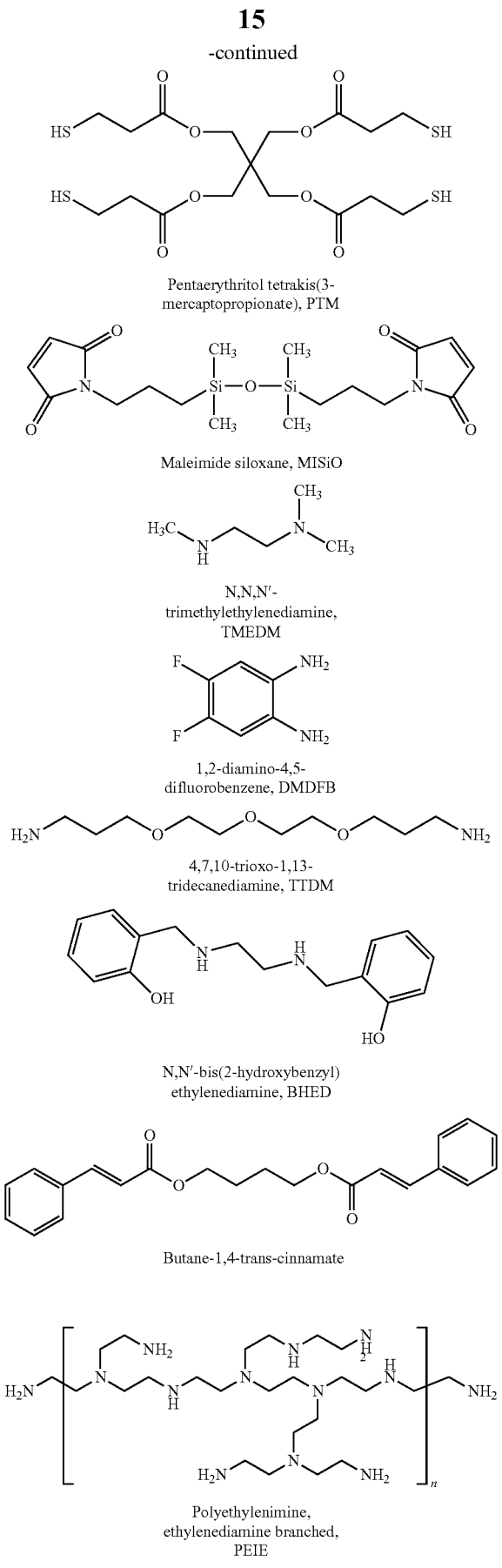

As described above, while a high crosslinking agent:polymer ratio in the polymer composition usually can induce a higher degree of photocrosslinking in the polymer film thereby improving its mechanical properties and chemical resistance, the presence of the crosslinking agent (and any photosensitizers and/or photoinitiators required by the photocrosslinking system) usually results in deterioration of the dielectric properties of the polymer.

Accordingly, the photosensitive non-nucleophilic base and the crosslinking agent generally are present in the present photopatternable composition, individually, at no more than about 10 wt % of the vinylidene fluoride-based polymer. For example, the photosensitive non-nucleophilic base can be present in the present photopatternable composition at no more than about 5 wt %, preferably no more than about 3 wt %, of the vinylidene fluoride-based polymer. Similarly, the crosslinking agent can be present in the present photopatternable composition at no more than about 10 wt % of the vinylidene fluoride-based polymer. It is preferred that the crosslinking agent is present at a higher mol % than the photosensitive non-nucleophilic base to make sure all double bonds created from dehydrohalogenation of the polymer are reacted to prevent the polymer from becoming electrically conducting.

As shown in the Examples below, despite the low crosslinking agent:polymer ratio, the present photopatternable composition can provide quickly-cured, robust thin films (for example, as demonstrated by minimal thickness loss after developing with various organic solvents) after no more than 10 minutes (typically, no more than about 5 minutes, and usually, no more than about 2 minutes) of photoexposure, and the dielectric constant of the resulting thin film dielectrics generally is 10 or higher, in some embodiments, 12 or higher, and in certain embodiments, 15 or higher. In particular embodiments, the dielectric constant of the resulting thin film dielectrics can be 20 or higher.

The vinylidene fluoride-based polymer, the photosensitive non-nucleophilic base, and the crosslinking agent can be mobilized in a liquid medium to provide a composition (a photopatternable composition) for forming a photopatternable material. The composition can be a solution, a dispersion, a suspension, an emulsion, or a gel, although in most embodiments, the composition is a solution or a dispersion suitable for solution-phase processes. The term "mobilized in a liquid medium" broadly means that the designated liquid medium causes a designated solid to take on properties of a liquid. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, or a gel. As used herein, the term "solution" means that a substantial proportion of a designated solute has formed a single phase with a designated solvent, but a substantial second phase that can include dispersed particulate matter also can be present.

The liquid medium can be an organic solvent or a solvent mixture in which each of the vinylidene fluoride-based polymer, the photosensitive non-nucleophilic base, and the crosslinking agent has satisfactory solubility. As used herein, a compound can be considered soluble in a solvent when at least 1 mg of the compound can be dissolved in 1 ml of the solvent. Examples of organic solvents that can be used in the present photopatternable composition include, but are not limited to, ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate (PGMEA), methyl lactate, ethyl lactate and γ-butyrolactone; ketone solvents such as acetone, acetylacetone, methyl ethyl ketone, methyl isobutyl ketone, 2-butanone, 2-pentanone, 3-pentanone, 2-heptanone, 3-heptanone, cyclopentanone, and cyclohexanone; halogenated solvents such as chloroform, carbon tetrachloride, and halogenated alkanes; and mixtures of any of the foregoing solvents.

Accordingly, the present photopatternable composition can be used to deposit thin film materials via various solution-phase processes known in the art, where the thin film materials can be subsequently photocrosslinked and become insoluble in the mother liquid medium used for film deposition. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For noncontact printing techniques such as inkjet printing, the solubility requirement generally can be less stringent and a solubility range as low as about 1-4 mg/ml can suffice. For gravure printing, a higher solubility range may be necessary, often in the range of about 20-100 mg/ml. Other contact printing techniques such as screen-printing and flexo printing can require even higher solubility ranges, for example, about 100-1000 mg/ml. Generally, the strength of the polymer in the present photopatternable composition can be between about 1 mg/ml and about 200 mg/ml, preferably between about 20 mg/ml and about 100 mg/ml.

In addition to the vinylidene fluoride-based polymer, the photosensitive non-nucleophilic base, and the crosslinking agent, the present photopatternable composition also can include one or more additives, processing aids and/or fillers (e.g., metal oxide nanoparticles). However, in preferred embodiments, the present photopatternable composition can exclude any inorganic (e.g., metal) fillers. The total solid loading of all the non-polymer components (i.e., the photosensitive non-nucleophilic base, the crosslinking agent, and any optional additives) can be between about 1 mg/ml and about 20 mg/ml, preferably less than about 10 mg/ml.

Materials (e.g., thin film dielectrics) prepared from the present photopatternable composition can be photopatterned directly (without using a photoresist). Accordingly, a patterned thin film dielectric component can be formed by depositing a photopatternable composition according to the present teachings to provide an uncrosslinked film, subjecting the uncrosslinked film to radiation in an imagewise pattern (for example, through a photomask) such that exposed areas of the film become crosslinked; and removing the unexposed areas (which remain uncrosslinked and soluble). More specifically, the process can include depositing the photopatternable composition on a substrate to form a film of desired thickness, exposing the film radiation (for example, flood exposure or irradiation at specific wavelengths in the UV region e.g., the H, I, or G line wavelengths) through a photomask (one having the desired imagewise pattern) to provide crosslinked areas and uncrosslinked areas, and subjecting the film to a developing agent to remove the uncrosslinked areas, thereby transferring the pattern of the photomask in a negative-tone manner to the film.

Thin film materials prepared from the present photopatternable composition can have good mechanical properties and chemical resistance. For example, after photocrosslinking, the thin film materials can become substantially insoluble in various organic solvents in which the pristine polymer is soluble. More specifically, the photocrosslinked film can be immersed in the mother solvent, for example, for a period of time sufficient to develop the desired pattern, and the loss in the thickness of the film ("thickness loss") can be less than about 50%, preferably less than about 20%, and more preferably less than about 10%. As used herein, a "thin film material" or a "thin film" is a layer of material deposited with controlled thickness typically between about 1 nm and about 5000 nm (or 5 microns). A "thin film transistor" is a transistor having a stacked architecture comprising different thin film layers. For example, a thin film transistor typically includes a thin film substrate having a thickness between about 10 nm and about 1000 nm, electrical contacts (source, drain, gate electrodes) having a thickness between about 10 nm and about 100 nm, a thin film semiconductor layer between about 50 nm and about 500 nm, and a thin film dielectric layer having a thickness between about 200 nm and about 1000 nm.

The present thin film materials generally have excellent dielectric properties. For example, the present thin film materials typically have a dielectric constant of 10 or greater. In certain embodiments, the present thin film materials can have a dielectric constant of about 15 or greater. In particular embodiments, the present thin film materials can have a dielectric constant of about 20. When used as a gate dielectric, the present thin film materials can exhibit very low leakage current densities. Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a metal-oxide-semiconductor (MOS) structure. As known by those skilled in the art, the leakage current density of a dielectric material can be determined by fabricating a standard metal-insulator-semiconductor (MIS) and/or metal-insulator-metal (MIM)

capacitor structures with the dielectric material, then measuring the leakage current, and dividing the measured current by the area of the metal electrodes. As measured from standard MIS and MIM capacitor structures, photopatterned thin film dielectrics according to the present teachings can have a leakage current density of less than or equal to about $2\times10^{-3}$ A/cm$^2$ at 1 MV/cm, less than or equal to about $5\times10^{-4}$ A/cm$^2$ at 1 MV/cm, or less than or equal to about $2\times10^{-4}$ A/cm$^2$ at 1 MV/cm.

Accordingly, photopatterned thin films according to the present teachings can be used as a patterned gate dielectric component in various electronic, optical, and optoelectronics devices. Such gate dielectric components can exhibit a wide range of desirable properties and characteristics including, but not limited to, low leakage current densities, high breakdown voltages, large capacitance values, thermal, air and moisture stability, resistance to harsh reagents, and/or compatibility with diverse interlayer, semiconductor and/or metal contact materials (including interfacial compatibility and compatibility with methods used to process such interlayer, semiconductor and/or metallic materials). The electronic, optical, or optoelectronic devices incorporating the present gate dielectric component, in turn, can have improved device performance including, but not limited to, low hysteresis, better stability, and lower operating voltages.

While pristine vinylidene fluoride-based polymers are ferroelectric (i.e., these polymers have a spontaneous electric polarization that can be reversed by the application of an external electric field), such ferroelectric properties can be detrimental to transistor performance causing threshold voltage shift and I-V hysteresis issues. By crosslinking the vinylidene fluoride-based polymers, the ferroelectric properties are significantly suppressed; however, there may be residual ferroelectric domains that can still negatively affect device performance. The inventors have found that by including a thin film of non-ferroelectric polymeric material between the patterned gate dielectric component and either the semiconductor layer or the gate electrode, enhanced device stability can be achieved. Without wishing to be bound by any particular theory, it is believed that the non-ferroelectric layer can help prevent the vinylidene fluoride-based polymer from forming ferroelectric domains when an electric field is applied. This is supported by experimental data obtained from MIM capacitor structures, where capacitors incorporating the bilayer dielectric showed steady capacitance that was independent of turn-on voltages as well as reduced gate leakage. While the patterned thin film dielectric component composed of the crosslinked vinylidene fluoride-based polymer typically has a thickness between about 200 nm and about 1000 nm, the second organic thin film layer composed of the non-ferroelectric polymer can be much thinner, for example, between about 10 nm and about 100 nm. Examples of non-ferroelectric polymers that are useful as dielectrics include CYTOP, polystyrene, polyethylene, poly-alpha-methylstyrene, polyisobutene, polypropylene, polyvinylcyclohexane, polymethylmethacrylate, and the like. Photocrosslinkable polymers (especially, UV-crosslinkable polymers) including those functionalized with coumarin, cinnamate, and/or diene moieties also can be used.

Non-limiting examples of electronic, optical, and optoelectronic devices that can include a gate dielectric component composed of the present thin film materials include capacitors, organic field-effect transistors, metal oxide field-effect transistors, and organic light-emitting transistors. Referring to FIG. 1, a field-effect transistor generally includes source and drain electrodes (2, 2', 2", 2'" and 4, 4', 4", 4'"), a semiconductor layer (6, 6', 6", 6'"), a gate dielectric layer (8, 8', 8", 8'"), a gate electrode (10, 10', 10", 10'"), a substrate (12, 12', 12", 12'"), and optionally one or more interlayers (e.g., a surface-modifying layer, a passivation layer, or an encapsulation layer). As known in the art, the gate electrode, and the source and drain electrodes can be arranged in different configurations relative to the gate dielectric layer and the semiconductor layer to provide, for example, a bottom-gate top-contact (FIG. 1a), a bottom-gate bottom-contact structure (FIG. 1b), a top-gate bottom-contact structure (FIG. 1c), and a top-gate top-contact structure (FIG. 1d). When a potential is applied on the gate electrode, charge carriers are accumulated in the semiconductor layer at an interface with the gate dielectric. As a result, a conductive channel is formed between the source electrode and the drain electrode and a current will flow if a potential is applied to the drain electrode.

A field-effect transistor according to the present teachings has a gate dielectric layer prepared from a photopatternable composition described herein, and can be characterized by an operating voltage that is less than about |40| V, preferably less than about |30| V, and more preferably less than about |20| V.

The semiconductor layer of a field-effect transistor according to the present teachings can be composed of one or more organic (small molecule or polymeric) semiconducting compounds or semiconducting metal oxides. In a metal oxide field-effect transistor, the semiconducting metal oxide can be selected from indium oxide (In$_2$O$_3$), indium zinc oxide (IZO), zinc tin oxide (ZTO), indium gallium oxide (IGO), indium-gallium-zinc oxide (IGZO), indium-gallium-oxide (IGO), indium-ittrium-oxide (IYO), indium tin zinc oxide (ITZO), tin oxide (SnO$_2$), and zinc oxide (ZnO). A metal oxide thin film semiconductor can be formed by sputtering from a target. Alternatively, solution-phase processes as described, for example, in U.S. Pat. No. 8,017,458, also can be used for preparing a metal oxide thin film semiconductor. An annealing step (between about 250-400° C., preferably below about 300° C.) can be performed to improve the semiconducting properties of the metal oxide layer.

In an organic field-effect transistor, the organic semiconductor layer can be composed of one or more small molecule and/or polymeric compounds that exhibit n-type (electron-transporting), p-type (hole-transporting), or ambipolar (both n-type and p-type) semiconducting activity. As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10. An "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10. The term "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

Exemplary p-type semiconductors include soluble pentacenes (e.g., those described in U.S. Pat. No. 7,125,989); oligothiophenes and polythiophenes (e.g., dihexyl quarterthiophene, DH4T, and regioregular poly(3-hexylthiophene, rr-P3HT); anthracenes such as 2-(4-hexylphenylvinyl)anthracene (see Dadvand et al., "Maximizing Field-Effect Mobility and Solid-State Luminescence in Organic Semiconductors," Angew. Chem. Int. Ed., 51: 3837-3841 (2012)); thienocoronene-based compounds (e.g., those described in International Publication No. WO2012/030662); alkylated [1]benzothieno[3,2-b]benzothiophenes (BTBTs) and alkylated dinaphtho[2,3-b:2',3'-f]thieno[3,2-b]thiophenes (DNTTs) (see e.g., Ebata, H. et al., "Highly Soluble [1]Benzothieno[3,2-b]benzothiophenes (BTBT) Derivatives for High-Performance, Solution-Processed Organic Field-Effect Transistors," JACS, 129(51): 15732-15733 (2007); and Ebata, H. et al., "Alkylated Dinaphtho[2,3-b:2',3'-f]Thieno[3,2-b]Thiophenes ($C_n$-DNTTs): Organic Semiconductors for High-Performance Thin-Film Transistors," Adv. Mat., 23(10): 1222-1225 (2011)); other thieno-fused compounds such as dibenzo[d,d']thieno[3,2-b;4,5-b']dithiophenes, naphtha[2,1-b:6,5-b']difurans, and fluorinated anthradithiophene derivatives (see Miyata et al., "High-performance organic field-effect transistors based on dihexyl-substituted dibenzo[d,d']thieno[3,2-b;4,5-b']dithiophene," J. Mater. Chem. (2012); Mitsui et al., "Naphtha[2,1-b:6,5-b']difurans: A Versatile Motif Available for Solution-Processed Single-Crystal Organic Field-Effect Transistors with High Hole Mobility," J. Am. Chem. Soc, 134: 5448-5451 (2012); and Subramanian et al., "Chromophore Fluorination Enhances Crystallization and Stability of Soluble Anthradithiophene Semiconductors," J. Am. Chem. Soc., 130(9): 2706-2707 (2008)); and phthalimide-based, diketopyrrolopyrrole-based, and isoindigo-based conjugated polymers (see International Publication No. WO2010/117449; Li et al., "A High Mobility P-Type DPP-Thieno[3,2-b]thiophene Copolymer for Organic Thin-Film Transistors," *Adv. Mater.*, 22: 4862-4866 (2010); Li et al., "Annealing-Free High-Mobility Diketopyrrolopyrrole-Quaterthiophene Copolymer for Solution-Processed Organic Thin Film Transistors," *J. Am. Chem. Soc.*, 133: 2198-2204 (2011); Bronstein et al., "Thieno[3,2-b] thiophene-Diketopyrrolopyrrole-Containing Polymers for High-Performance Organic Field-Effect Transistors and Organic Photovoltaic Devices," *J. Am. Chem. Soc.*, 133: 3272-3275 (2011); Chen et al., "Highly pi-Extended Copolymers with Diketopyrrolopyrrole Moieties for High-Performance Field-Effect Transistors," *Adv. Mater.* (2012); Mei et al., "Siloxane-Terminated Solubilizing Side Chains: Bringing Conjugated Polymer Backbones Closer and Boosting Hole Mobilities in Thin-Film Transistors," *J. Am. Chem. Soc.*, 133: 20130-20133 (2011); and Lei et al., "High-Performance Air-Stable Organic Field-Effect Transistors: Isoindigo-Based Conjugated Polymers," *J. Am. Chem. Soc.*, 133: 6099-6101 (2011)). Additional examples of p-type semiconductors include linear acenes, bent acenes, arylvinylenes, phenylenes, and fused (hetero)arenes substituted with alkyl and/or alkoxy groups.

Exemplary n-type semiconductors include fluorocarbon substituted-oligothiophenes (e.g., α,ω-diperfluorohexylsexithiophenes and other fluorocarbon-substituted thiophene oligomers are described in U.S. Pat. No. 6,585,914); fused ring tetracarboxylic diimides and their derivatives (e.g., cyanated perylene diimides (PDIs) or naphthalene diimides (NDIs) such as those described in U.S. Pat. No. 7,671,202); hybrid PDIs/NDIs, pi-bridge linked dimeric NDIs, and large disc-like ovalene diimides (see e.g., Yue et al., "Hybrid Rylene Arrays via Combination of Stille Coupling and C—H Transformation as High-Performance Electron Transport Materials," J. Am. Chem. Soc. (2012); Hwang et al., "Stable Solution-Processed Molecular n-Channel Organic Field-Effect Transistors," Adv. Mater. (2012); Polander et al., "Solution-Processed Molecular Bis (Naphthalene Diimide) Derivatives with High Electron Mobility," Chem. Mater., 23: 3408-3410 (2011); and Li et al., "Disc-like 7,14-dicyano-ovalene-3,4:10,11-bis(dicarboximide) as a solution-processible n-type semiconductor for air stable field-effect transistors," Chem. Sci., 3: 846-850 (2012)); NDIs fused with 2-(1,3-dithiol-2-ylidene)malononitrile groups (see e.g., Gao et al., "Core-Expanded Naphthalene Diimides Fused with 2-(1,3-Ditiol-2-Ylidene)Malonitrile Groups for High-Performance Ambient-Stable, Solution-Processed n-Channel Organic Thin Film Transistors," J. Am. Chem. Soc., 132(11): 3697-3699 (2010)); dicyanomethylene-substituted conjugated systems (e.g., those described in U.S. Pat. No. 7,928,249 and Qiao et al., "Diketopyrrolopyrrole-Containing Quinoidal Small Molecules for High-Performance, Air-Stable, and Solution-Processable n-Channel Organic Field-Effect Transistors," J. Am. Chem. Soc., 134: 4084-4087 (2012)); thionated aromatic bisimides (e.g., those described in International Publication No. WO2011/082234); NDI-containing polymers (e.g., those described in U.S. Patent Application Publication No. US 2010/0326527); and thiophene-imide polymers (e.g., those described in International Publication No. WO2012/156948). Additional examples of n-type semiconductors include linear acenes, bent acenes, arylvinylenes, phenylenes, and fused (hetero)arenes substituted with alkylcarbonyl, arylcarbonyl, and/or cyano groups.

A plurality of organic and/or metal oxide field-effect transistors can be arranged in an array which can be used as switching devices or peripheral drivers in active matrix liquid crystal displays (AMLCDs) and as pixel drivers for active matrix organic light-emitting diodes (AMOLEDs).

Organic light-emitting transistor (OLET) is a recently developed optoelectronic device that combines the switching mechanism of a thin-film transistor and an electroluminescent device. While charge transport occurs perpendicular to the organic layers in an OLED, the majority of the current flows horizontally through the semiconducting layers in an OLET. As a result, light in an OLET is emitted as a stripe along the emissive layer, rather than uniformly through the electrode areas as in conventional OLEDs. The planar transport geometry of OLETs helps suppress deleterious photon losses and exciton quenching mechanisms inherent in the OLED architecture. Accordingly, the same organic electroluminescent light-emitting material has been shown to achieve much higher external quantum efficiency (EQE) in an OLET than in an equivalent OLED.

Figure 2:
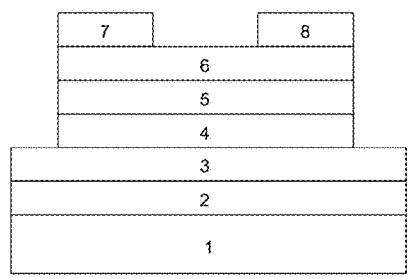
FIG. 2 shows the structure of an exemplary organic light-emitting transistor (OLET).

Like conventional OFETs, an organic light-emitting transistor (OLET) includes a number of layers and can be configured in various ways. For example, referring to FIG. 2, a trilayer heterostructure bottom-gate top-contact OLET can include, from bottom to top, a transparent substrate (1), a gate electrode (2), a gate dielectric (3), an active layer consisting of the superposition of three organic layers (4, 5, 6), and source and drain electrodes (7, 8) on top of the active layer. The trilayer active layer generally includes a light-emitting host-guest matrix sandwiched between an n-type (electron-transporting) semiconductor and a p-type (hole-transporting) semiconductor. One or more optional layers (e.g., charge injection layers) and/or additional electrodes can be present, for example, as described in U.S. Patent Application Publication Nos. 2014/0054566 and 2014/0054613, and International Publication Nos. WO2013/017999, WO2013/018000, and WO2013/018002. An OLET can be operated by applying a first appropriate bias voltage to the gate electrode, and injecting electrons from the electron electrode and holes from the hole electrode, while maintaining a second bias voltage between the latter two electrodes. The first and second bias voltages can be continuous voltages. Alternatively, the first and second bias voltages also can be pulsed voltages.

OLETs of different architectures can be fabricated using processes known to those skilled in the art as described in, for example, International Publication Nos. WO2013/018000 and WO2013/128344. For example, in a bottom-gate configuration, an optional planarization or surface-modifying layer can be formed onto a transparent substrate, e.g., by spin-coating. A metallic thin film can be thermally evaporated thereon, followed by etching or other patterning techniques to form the gate electrode. An OLET according to the present teachings incorporates a patterned high-k thin film dielectric herein as the gate electric, wherein the patterned high-k thin film dielectric can be prepared by depositing (e.g., spin-coating) onto the gate electrode a film from a photopatternable composition comprising a vinylidene fluoride-based polymer, a photosensitive non-nucleophilic base, and a crosslinking agent as described herein; drying the film; photopatterning the film (exposing the film to radiation through a photomask thereby inducing photocrosslinking in the exposed areas, and subsequently using a developer to remove the soluble, unexposed areas), and optionally annealing the film. Optionally, a second thin film dielectric comprising a non-ferroelectric polymer can be deposited on the patterned high-k thin film dielectric before deposition and patterning of the high-k thin film dielectric. This second thin film dielectric can be photopatternable, in which case, the photopatterning step of the high-k thin film dielectric can be delayed and conducted together with the photopatterning of the non-ferroelectric polymer. The active channel layer can be prepared over the gate dielectric via sequential deposition of a first charge transport sublayer (e.g., hole transport sublayer), an emissive sublayer, and a second charge transport sublayer (e.g., electron transport sublayer). In general, the various organic layers can be formed by chemical vapor deposition, physical vapor deposition, different types of printing techniques (e.g., flexo printing, litho printing, gravure printing, ink-jetting, pad printing, and so forth), drop casting, slot coating, dip coating, doctor blading, roll coating, or spin-coating.

Various p-type semiconductors, n-type semiconductors, and organic electroluminescence semiconductors known in the art can be used as the hole transport sublayer, the electron transport sublayer, and the emissive sublayer. For example, the channel layer can comprise one or more of the small molecule or polymeric p-type and n-type semiconducting compounds described hereinabove in connection with organic field-effect transistors. Depending on the light emission type (red, green or blue), the energy of the hole-transporting semiconductor material must match that of the electron transporting semiconductor material. Thus, for red emission, the energy difference between the highest occupied molecular orbital (HOMO) of the hole-transporting semiconductor material and the lowest unoccupied molecular orbital (LUMO) of the electron-transporting semiconductor material should be, at a minimum, between about 1.6V and about 1.8 eV. For green emission, the energy difference between the HOMO of the hole-transporting semiconductor material and the LUMO of the electron-transporting semiconductor material has to be, at a minimum, between about 2.2 eV and about 2.5 eV. For blue emission, the energy difference between the HOMO of the hole-transporting semiconductor material and the LUMO of the electron-transporting semiconductor material has to be, at a minimum, between about 2.8 eV and about 3.2 eV.

The emissive sublayer can be a blend that includes a host material and a guest emitter selected from a fluorescent emitter and a phosphorescent emitter. Alternatively, the emissive sublayer can be prepared from a single-component host-emitting material. Suitable organic electroluminescent light-emitting materials include those having been used in OLED applications. For example, the emissive sublayer can be composed of a blend of host tris(8-hydroxyquinolinato) aluminium ($Alq_3$) and guest 4-(dicyanomethylene)-2-methyl-6-(p-dimethylaminostyryl)-4H-pyran (DCM). Further examples of host materials, guest emitters, and single-component host-emitting materials are described in Chaskar et al., "Bipolar Host Materials: A Chemical Approach for Highly Efficient Electrophosphorescent Devices," *Adv. Mater.*, 23(34): 3876-3895 (2011); Tao et al., "Organic host materials for phosphorescent organic light-emitting diodes," *Chem. Soc. Rev.*, 40(5): 2943-2970 (2011); Sasabe et al., "Multifunctional Materials in High-Performance OLEDs: Challenges for Solid-State Lighting," *Chem. Mater.*, 23(3): 621-630 (2011); Tsuboi, "Recent advances in white organic light emitting diodes with a single emissive dopant," *J. Non-Cryst. Solids*, 356(37-40): 1919-1927 (201); Singh et al., "Bio-organic optoelectronic devices using DNA," *Adv. Polym. Sci.*, 223 (Organic Electronics): 189-212 (2010); Kappaun et al., "Phosphorescent organic light-emitting devices: working principle and iridium based emitter materials," *Int. J. Mol. Sci.*, 9(8): 1527-1547 (2008); Tokito et al., "Phosphorescent organic light-emitting devices: triplet energy management," *Electrochemistry*, 76(1): 24-31 (2008); Chen, "Evolution of Red Organic Light-Emitting Diodes: Materials and Devices," *Chem. Mater.*, 16(23): 4389-4400 (2004); Liu et al., "Polyfluorenes with on-chain metal centers," *Adv. Poly. Sci.*, 212 (Polyfluorenes): 125-144 (2008); Danev et al., "Vacuum deposited polyimide—a perfect matrix for nanocomposite materials," *J. Optoelectron. Adv. Mater.*, 7(3): 1179-1190 (2005); U.S. Pat. Nos. 5,747,183; 5,683,823; 6,626,722; 7,074,502; 7,671,241; and 7,772,762.

Some exemplary host materials include polymers such as poly(p-phenylene vinylene), poly(alkyphenylphenylvinylene), poly(alkyphenylphenylvinylene-co-alkoxyphenylenevinylene), polyfluorene, poly(n-vinylcarbazole), and copolymers thereof. Various carbazole compounds, triphenylamine compounds, including hybrids with oxadiazole or benzimidazole also have been used as host materials. Some exemplary guest emitters (light-emitting dyes or dopants) include fluorescent dyes such as various perylene derivatives, anthracene derivatives, rubrene derivatives, carbazole derivatives, fluorene derivatives, and quinacridone derivatives, and phosphorescent emitters such as various transition metal complexes including Ir, Os, or Pt. Some exemplary host-emitting materials include phosphorescent host-emitting compounds based on carbazole derivatives, fluorene derivatives, or 9-naphthylanthracene derivatives, and fluorescent host-emitting compounds based on organometallic chelates such as tris(8-quinolinol) aluminum complexes.

The hole/electron (or source/drain) electrodes can be formed using similar or different techniques as the gate electrode. For example, any of the electrical contacts can be deposited through a mask, or can be deposited then etched or lifted off (photolithography). Suitable deposition techniques include electrodeposition, vaporization, sputtering, electroplating, coating, laser ablation and offset printing, from metal or metal alloy including copper, aluminum, gold, silver, molybdenum, platinum, palladium, and/or nickel, or an electrically conductive polymer such as polyethylenethioxythiophene (PEDOT). Charge carrier injection can be facilitated by the use of a material for the injection electrode (hole electrode or electron electrode) that has a low barrier against injection of a charge carrier type into the hole transport sublayer and the electron transport sublayer, respectively. For example, the electron electrode can comprise one or more elements selected from the group consisting of Au, Ca, Mg, Al, In, and a perovskite manganites ($RE_{1-x}A_xMnO_3$, RE=rare earth element such as La, Nd, Pr etc., A=alkaline metal). The hole electrode can comprise at least one material selected from the group consisting of Au, indium tin oxide, Cr, Cu, Fe, Ag, poly(3,4-ethylenedioxthiophene) combined with poly(styrenesulfonate) (PEDOT: PSS), and a perovskite manganite ($Re_{1-x}A_xMnO_3$). In certain embodiments, the hole electrode and the electron electrode can be made of conductors with different work functions to favor both hole and electron injection.

If present, the hole and electron injection layers can be prepared by self-assembly of thiolates, phosphonates, or aliphatic or aromatic carboxylates; by thermal evaporation of various charge transfer complexes and other heteroaromatic or organometallic complexes; or by thermal evaporation or sputtering of various metal oxides, fluorides, or carbonates. The hole injection layer and the electron injection layer can be made of materials that provide a staircase of electronic levels between the energy level of the hole electrode and the electron electrode, and the energy level required for injection into the hole transport sublayer and the electron transport sublayer, respectively. See e.g., Li et al., "Low operating-voltage and high power-efficiency OLED employing $MoO_3$-doped CuPc as hole injection layer," *Displays*, 33(1): 17-20 (2012); Wen et al., "Self-assembled of conducting polymeric nanoparticles and its application for OLED hole injection layer," *Energy Procedia*, 12: 609-614 (2011); Zhang et al., "Role of $Fe_3O_4$ as a p-dopant in improving the hole injection and transport of organic light-emitting devices," *IEEE Journal of Quantum Electronics*, 47(5): 591-596 (2011); Choo et al., "Luminance and charge transport mechanisms for phosphorescent organic light-emitting devices fabricated utilizing a tris(2-phenylpyridine) iridium-doped N,N'-dicarbazolyl-3,5-benzene emitting layer," *Thin Solid Films*, 519(15): 5253-5256 (2011); Tao et al., "Odd-even modulation of electrode work function with self-assembled layer: Interplay of energy barrier and tunneling distance on charge injection in organic light-emitting diodes," *Organic Electronics*, 12(4): 602-608 (2011); Sung et al., "AC Field-Induced Polymer Electroluminescence with Single Wall Carbon Nanotubes," *Nano Letters*, 11(3): 966-972 (2011); Qiao et al., "Controlling charge balance and exciton recombination by bipolar host in single-layer organic light-emitting diodes," *Journal of Applied Physics*, 108(3): 034508/1-034508/8 (2011); Khizar-ul-Haq et al., "Blue organic light-emitting diodes with low driving voltage and enhanced power efficiency based on $MoO_3$ as hole injection layer and optimized charge balance," *Journal of Non-Crystalline Solids*, 356(20-22): 1012-1015 (2010); Qi et al., "Analysis of metal-oxide-based charge generation layers used in stacked organic light-emitting diodes," *Journal of Applied Physics*, 107(1): 014514/1-014514/8 (201); Huang et al., "Materials and interface engineering in organic light-emitting diodes," Organic Electronics, 243-261 (2010); Helander et al., "Comparison of $Alq_3$/alkali-metal fluoride/Al cathodes for organic electroluminescent devices," *Journal of Applied Physics*, 104(9): 094510/1-094510/6 (2008); Roy Choudhury et al., "LiF as an n-dopant in tris(8-hydroxyquinoline) aluminum thin films," *Advanced Materials*, 20(8): 1456-1461 (2008); Vacca et al., "Poly(3, 4-ethylenedioxythiophene):poly(4-styrenesulfonate) ratio: Structural, physical and hole injection properties in organic light emitting diodes," *Thin Solid Films*, 516(12): 4232-4237 (2008); Yang et al., "Improved fabrication process for enhancing light emission in single-layer organic light-emitting devices doped with organic salt," Japanese Journal of Applied Physics, 47(2, Pt. 1): 1101-1103 (2008); Kim et al., "UV-ozone surface treatment of indium-tin-oxide in organic light emitting diodes," Journal of the Korean Physical Society, 50(6): 1858-1861 (2007); Prat et al., "Stable, highly efficient and temperature resistant organic light-emitting devices," *Japanese Journal of Applied Physics, Part 1: Regular Papers, Brief Communications & Review Papers,"* 46(4A): 1727-1730 (2007); Luo et al., "Improving the stability of organic light-emitting devices by using a hole-injection-tunable-anode-buffer-layer," *Journal of Applied Physics*, 101(5): 054512/1-054512/4 (2007); Matsushima et al., "Charge-carrier injection characteristics at organic/organic heterojunction interfaces in organic light-emitting diodes," *Chemical Physics Letters*, 435(4-6): 327-330 (2007); Kim et al., "Controllable work function of Li—Al alloy nanolayers for organic light-emitting devices," *Advanced Engineering Materials*, 7(11): 1023-1027 (2005); Kato, "Designing Interfaces That Function to Facilitate Charge Injection in Organic Light-Emitting Diodes," *Journal of the American Chemical Society*, 127(33): 11538-11539 (2005); Veinot et al., "Toward the Ideal Organic Light-Emitting Diode. The Versatility and Utility of Interfacial Tailoring by Cross-Linked Siloxane Interlayers," *Accounts of Chemical Research*, 38(8): 632-643 (2005); Oyamada et al., "Extremely low-voltage driving of organic light-emitting diodes with a Cs-doped phenyldipyrenylphosphine oxide layer as an electron-injection layer," *Applied Physics Letters*, 86(3): 033503/1-033503/3 (2005); Hughes et al., "Electron-transporting materials for organic electroluminescent and electrophosphorescent devices," *Journal of Materials Chemistry*, 15(1): 94-107 (2005); D'Andrade et al., "Efficient organic electrophosphorescent white-light-emitting device with a triple doped emissive layer," *Advanced Materials*, 16(7): 624-628 (2004); Kanno et al., "Development of OLED with high stability and luminance efficiency by co-doping methods for full color displays," *IEEE Journal of Selected Topics in Quantum Electronics*, 10(1): 30-36 (2004); Han et al., "Transparent-cathode for top-emission organic light-emitting diodes," *Applied Physics Letters*, 82(16): 2715-2717 (2003); Tutis et al., "Internal electric field and charge distribution in multilayer organic light-emitting diodes," *Journal of Applied Physics*, 93(8): 4594-4602 (2003); Mathai et al., "Controlled injection of holes into AlQ3 based OLEDs by means of an oxidized transport layer," *Materials Research Society Symposium Proceedings*, 708 (Organic Optoelectronic Materials, Processing and Devices): 101-106 (2002); Crone et al., "Charge injection and transport in single-layer organic light-emitting diodes," *Applied Physics Letters*, 73(21): 3162-3164 (1998); and Park et al., "Charge injection and photooxidation of single conjugated polymer molecules," *Journal of the American Chemical Society*, 126(13): 4116-7 (2004).

OLETs according to the present teachings can be fabricated on various substrates including plastic, flexible substrates that have a low temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be a rigid transparent substrate such as glass, quartz and VYCOR®. Substrate-gate materials commonly used in thin-film transistors also can be used. Examples include doped silicon wafer, tin-doped indium oxide (ITO) on glass, tin-doped indium oxide on polyimide or mylar film, aluminum or other metals alone or coated on a polymer such as polyethylene terephthalate, a doped polythiophene, and the like.

A plurality of OLETs can be arranged in a matrix to provide a display device. The display device can include optional driving and switching elements, compensating transistor elements, capacitors, and/or light-emitting diodes.

In the following examples, photopatternable polymeric materials according to the present teachings were prepared and characterized by various analytical techniques including optical microscopy, metal-insulator-metal (MIM) device leakage and capacitance measurements, to demonstrate, among other things, their dielectric properties, chemical resistance, and compatibility with organic semiconductors and photolithography processes. Electronic devices, for example, organic thin film transistors incorporating these polymeric films also have been fabricated and characterized, data of which are provided below.

The following examples are provided to illustrate further and to facilitate the understanding of the present teachings and are not in any way intended to limit the invention.

Example 1. P(VDF-TrFE-CFE)-Based Compositions, Film Fabrication and Photocuring

This example demonstrates the photocrosslinkability of various embodiments of the present photopatternable compositions based on P(VDF-TrFE-CFE). Formulations with different photosensitive non-nucleophilic base and crosslinking agents were tested and compared to a control formulation with neither a crosslinking agent nor a photosensitive non-nucleophilic base, and a control formulation with only a crosslinking agent but not a photosensitive non-nucleophilic base.

P(VDF-TrFE-CFE)-based photopatternable compositions according to the present teachings were prepared by dissolving ~60-100 mg P[(VDF)$_x$-(TrFE)$_y$-(CFE)$_z$] (x=59-65%; y=29-33%; z=6-8%) in 1 mL of cyclopentanone, followed by addition of the photosensitive non-nucleophilic base (about 1-5% by weight) and the crosslinking agent (about 3-10% by weight), and stirring for at least one hour before spin-coating. The compositions were spin-coated onto clean ITO substrates at 1000-4000 rpm to give films of thickness in the range of about 400-700 nm. Polycrystalline ITO 60 nm (sheet resistance 100Ω/□) on glass substrates were cleaned by sonication sequentially in Liquinox® solution, deionized water, acetone and isopropyl alcohol before use. After spin-coating the film, the resulting films were exposed to ultraviolet light generated from a 400 W medium pressure mercury arc lamp at a distance of about 20 cm from the lamp housing for up to 240 s. The films were then annealed on a 110° C. hot plate for about 1-5 minutes to remove any volatile additives that were not reacted during the photocuring process.

The exposed films were developed by soaking the films for about 30-60 s in a variety of solvents (butyl acetate, cyclopentanone, propylene glycol methyl ether acetate, and methyl ethyl ketone), followed by a hard bake at 110° C. for about 10 minutes to remove any residual solvents.

Table 1 summarizes the remaining thickness of the different films tested after development with common organic solvents. As shown, compositions including P(VDF-TrFE-CFE), the crosslinking agent, and the photosensitive non-nucleophilic base led to physically robust, highly photocured films, whereas neither of the control films survived after development, indicating a lack of photocrosslinking.

TABLE 1

| Vinylidene fluoride-based polymer | Photosensitive non-nucleophilic base | Crosslinking agent | Remaining thickness after developing |
|---|---|---|---|
| P(VDF-TrFE-CFE) | PrS | PMS | >80% |
| | PrS | PTM | >80% |
| | PrS | Versalink ® P-650 | >90% |
| | PrS | TDDM | >80% |
| | PrS | MISiO | >80% |
| | E-PrS | PMS | >70% |
| | EH-PrS | PMS | >80% |
| | None | PMS | 0% |
| | None | None | 0% |

Figure 3:
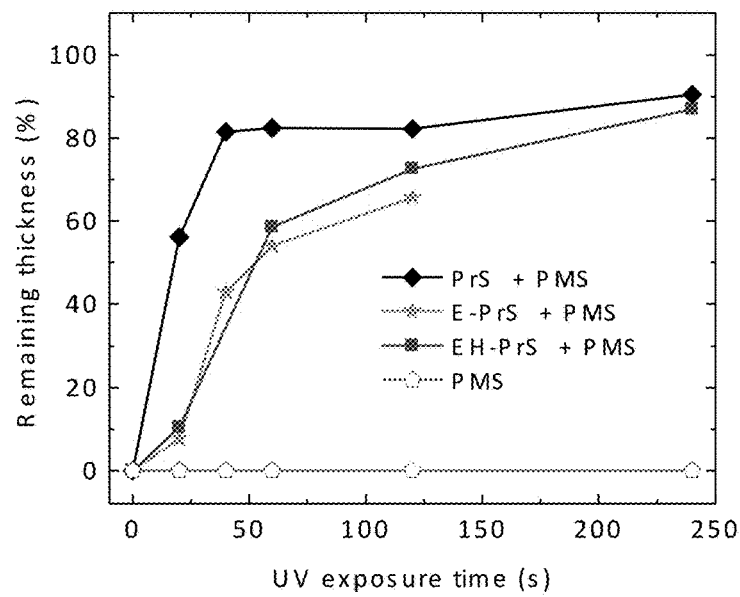
FIG. 3 shows the curing speed curves for various P(VDF-TrFE-CFE)-based formulations according to the present teachings.
Figure 3:
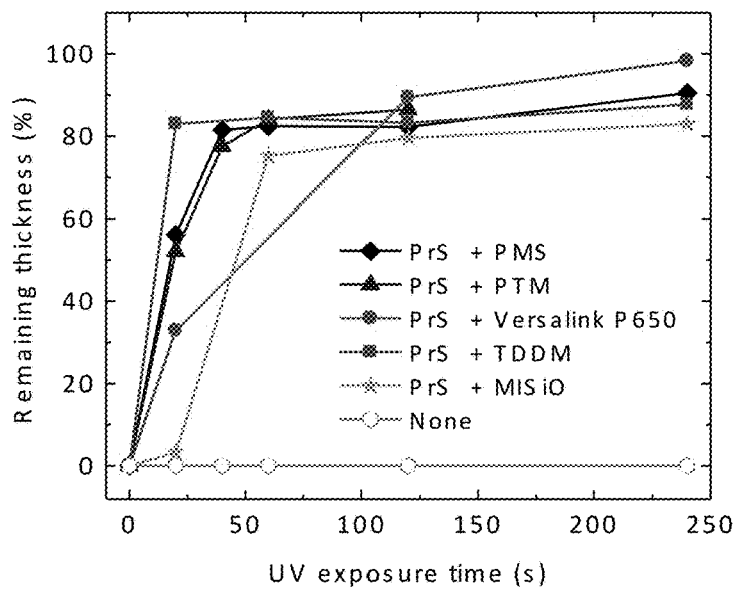

FIGS. 3a and 3b show the curing speed curves for various P(VDF-TrFE-CFE)-based formulations. In FIG. 3a, all the formulations include PMS as the crosslinking agent but different photosensitive non-nucleophilic base. In FIG. 1b, all the formulations include proton sponge as the photosensitive non-nucleophilic base but different crosslinking agents.

Additional control films were prepared from formulations including P(VDF-TrFE-CFE) and different photosensitive non-nucleophilic base but no crosslinking agent. The films were exposed to UV light as described in Example 1 (~40-240 s). The exposed films then were developed by soaking the films for ~30-60 s in a variety of solvents (butyl acetate, cyclopentanone, propylene glycol methyl ether acetate, and methyl ethyl ketone) followed by a hard bake at 110° C. for 10 minutes to remove any residual solvents.

Figure 4:
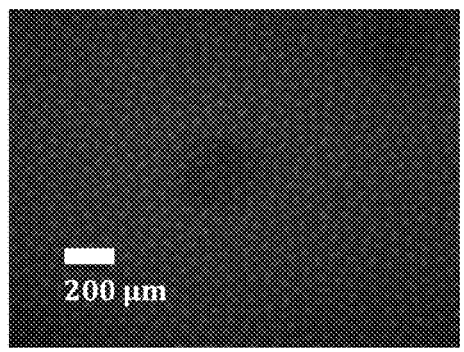
FIG. 4 shows representative optical images of films prepared from control P(VDF-TrFE-CFE)-based formulations without crosslinker after UV exposure and development.
Figure 4:
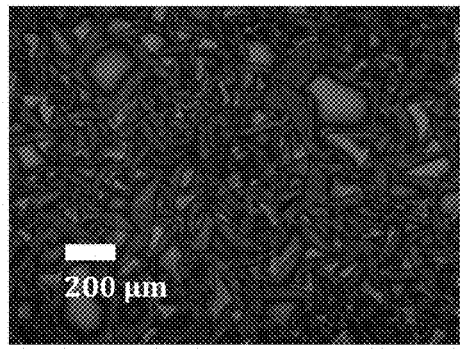

FIG. 4 shows the optical images of the resulting films. Although the developing step did not remove the films completely, the film surface was severely damaged with surface RMS roughness measured at >15 nm.

Figure 5:
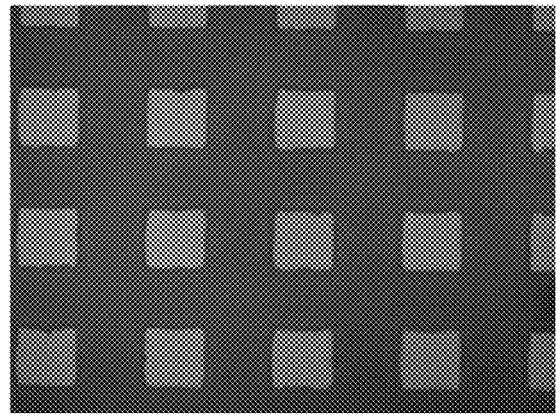
FIG. 5 shows the photopatternability of compositions according to the present teachings: (a) an optical image of a photopatterned film prepared from a P(VDF-TrFE-CFE)-based formulation with via hole openings (250 μm×250 μm); (b) the line profile across one of the via holes as measured by a profilometer. Good resolution is evident in the well-defined edges.
Figure 5:
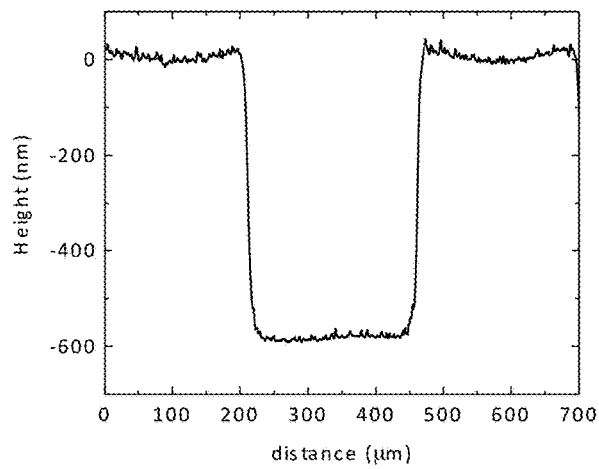

Example 2. Photopatternability of P(VDF-TrFE-CFE)-Based Compositions and Via Hole Formation The dielectric film exposed to ultraviolet light through a photo mask exhibited a clear pattern negative to that of the photo mask when developed with the solvent used for spin-coating. FIG. 5a shows an optical microscopy image of 250 μm×250 μm size via holes opened in the P(VDF-TrFE-CFE) film through the photo mask with well-defined edges. A line scan across a representative via hole is shown in FIG. 5b.

Example 3. P(VDF-HFP)-Based Compositions, Film Fabrication and Photocuring

This example demonstrates the photocrosslinkability of various embodiments of the present photopatternable compositions based on P(VDF-HFP). Formulations with different photosensitive non-nucleophilic base and crosslinking agents were tested and compared to a control formulation with neither a crosslinking agent nor a photosensitive non-nucleophilic base.

P(VDF-HFP)-based photopatternable compositions according to the present teachings were prepared by dissolving ~60-100 mg P(VDF-HFP) in 1 mL of cyclopentanone, followed by addition of the photosensitive non-nucleophilic base (about 1-5% by weight) and the crosslinking agent (about 3-10% by weight), and stirring for at least one hour before spin-coating. The compositions were spin-coated onto clean ITO substrates at 1000-4000 rpm to give films of thickness in the range of about 400-700 nm. Polycrystalline ITO 60 nm (sheet resistance 100Ω/□) on glass substrates were cleaned by sonication sequentially in Liquinox® solution, deionized water, acetone and isopropyl alcohol before use. After spin-coating the film, the resulting films were exposed to ultraviolet light generated from a 400 W medium pressure mercury arc lamp at a distance of about 20 cm from the lamp housing for up to 240 s. The films were then annealed on a 110° C. hot plate for about 1-5 minutes to remove any volatile additives that were not reacted during the photocuring process.

The exposed films were developed by soaking the films for about 30-60 s in a variety of solvents (butyl acetate, cyclopentanone, propylene glycol methyl ether acetate, and methyl ethyl ketone), followed by a hard bake at 110° C. for about 10 minutes to remove any residual solvents.

TABLE 2

| Vinylidene fluoride-based polymer | Photosensitive non-nucleo-philic base | Crosslinking agent | Remaining thickness after developing |
|---|---|---|---|
| P(VDF-HFP) | PrS | PMS | >95% |
| | PrS | TDDM | >80% |
| | PrS | MISiO | >95% |
| | TMPNTL | PMS | >95% |
| | EH-PrS | PMS | >95% |
| | None | None | 0% |

Figure 6:
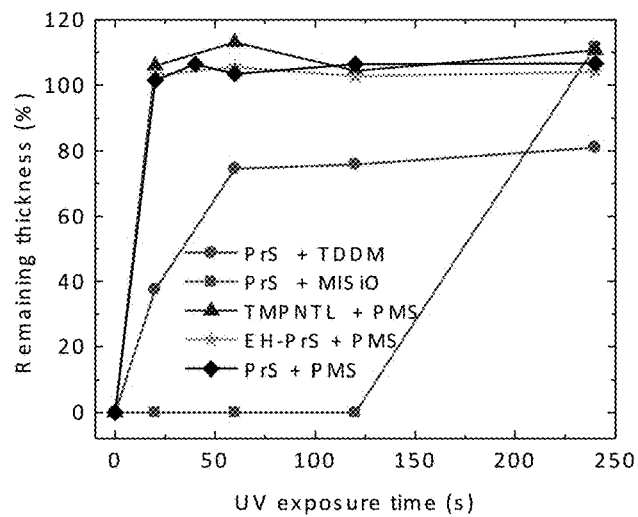
FIG. 6 shows the curing speed curves for various P(VDF-HFP)-based formulations according to the present teachings.

Table 2 above summarizes the remaining thickness of the different films tested after development with common organic solvents. FIG. 6 shows the curing speed curves for various P(VDF-HFP)-based formulations. As shown, compositions including P(VDF-HFP), the crosslinking agent, and the photosensitive non-nucleophilic base led to physically robust, highly photocured films, whereas the control film (with neither a crosslinking agent nor a photosensitive non-nucleophilic base) was completely removed after development, indicating a lack of photocrosslinking.

Example 4. P(VDF-TrFE)-Based Compositions, Film Fabrication and Photocuring

This example demonstrates the photocrosslinkability of various embodiments of the present photopatternable compositions based on P(VDF-TrFE). Formulations with different photosensitive non-nucleophilic base and crosslinking agents were tested and compared to a control formulation with neither a crosslinking agent nor a photosensitive non-nucleophilic base.

P(VDF-TrFE)-based photopatternable compositions according to the present teachings were prepared by dissolving ~60-100 mg P(VDF-HFP) in 1 mL of cyclopentanone, followed by addition of the photosensitive non-nucleophilic base (about 1-5% by weight) and the crosslinking agent (about 3-10% by weight), and stirring for at least one hour before spin-coating. The compositions were spin-coated onto clean ITO substrates at 1000-4000 rpm to give films of thickness in the range of about 400-700 nm. Polycrystalline ITO 60 nm (sheet resistance 100Ω/□) on glass substrates were cleaned by sonication sequentially in Liquinox® solution, deionized water, acetone and isopropyl alcohol before use. After spin-coating the film, the resulting films were exposed to ultraviolet light generated from a 400 W medium pressure mercury arc lamp at a distance of about 20 cm from the lamp housing for up to 240 s. The films were then annealed on a 110° C. hot plate for about 1-5 minutes to remove any volatile additives that were not reacted during the photocuring process.

The exposed films were developed by soaking the films for about 30-60 s in a variety of solvents (butyl acetate, cyclopentanone, propylene glycol methyl ether acetate, and methyl ethyl ketone), followed by a hard bake at 110° C. for about 10 minutes to remove any residual solvents.

Figure 7:
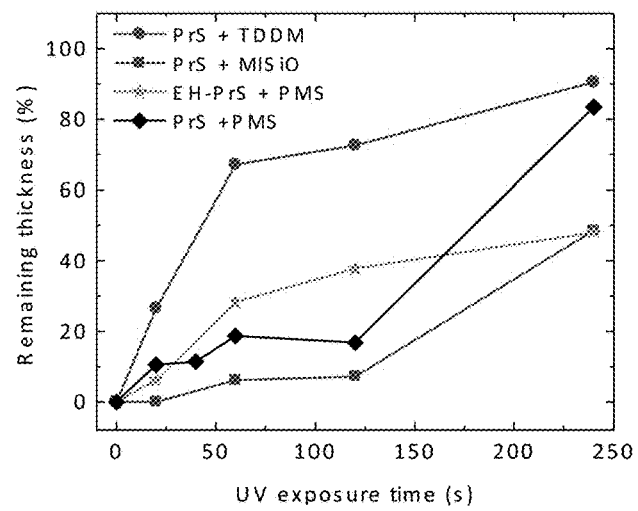
FIG. 7 shows the curing speed curves for various P(VDF-HFP)-based formulations according to the present teachings.

Table 3 summarizes the remaining thickness of the different films tested after development with common organic solvents. FIG. 7 shows the curing speed curves for various P(VDF-TrFE)-based formulations. As shown, compositions including P(VDF-TrFE), the crosslinking agent, and the photosensitive non-nucleophilic base led to physically robust, highly photocured films, whereas the control film (with neither a crosslinking agent nor a photosensitive non-nucleophilic base) was completely removed after development, indicating a lack of photocrosslinking.

TABLE 3

| Vinylidene fluoride-based polymer | Photosensitive non-nucleo-philic base | Crosslinking agent | Remaining thickness after developing |
|---|---|---|---|
| P(VDF-TrFE) | PrS | PMS | >80% |
| | PrS | TDDM | >80% |
| | PrS | MISiO | ~50% |
| | EH-PrS | PMS | ~50% |
| | None | None | 0% |

Example 5. Dielectric Characterization

Metal-insulator-metal (MIM) capacitor structures were fabricated using dielectric films according to the present teachings. The capacitance of the dielectric films was measured. For MIM structure fabrication, polycrystalline ITO on glass was used as the bottom electrode onto which the dielectric film was spin-coated to form the insulating layer. To photocrosslink the dielectric film, the spin-coated films were exposed in the Dymax Flood UV lamp (Model 2000-EC) for 2 minutes and were developed by PGMEA.

Top square-shaped gold electrodes, of which the feature size ranges from 100 μm×100 μm to 2000 μm×2000 μm, were thermally evaporated in vacuum through shadow masks on top of the dielectric layers to complete the MIM capacitance structures.

The capacitance values were obtained from measurements taken with a digital capacitance meter (GLK instrument Model 3000) operated at 24 kHz and DC voltage 5V. Table 4 compares the capacitance values and the dielectric constants of pristine P(VDF-TrFE-CFE), P(VDF-TrFE), and P(VDF-HFP) films versus photocrosslinked films prepared from compositions according to the present teachings based on the same polymers. As used herein, "pristine" refers to films prepared from polymer compositions that include neither a crosslinking agent nor a photosensitive non-nucleophilic base. Also, pristine films are not crosslinked. All of the films are about 600 nm thick.

TABLE 4

| Polymer dielectric | Capacitance (nF/cm$^2$) | Dielectric constant k |
|---|---|---|
| P(VDF-TrFE-CFE) | 55~76 | 38~52 |
| Photocured P(VDF-TrFE-CFE) | 27~53 | 18~36 |
| P(VDF-TrFE) | 19~22 | 13~15 |
| Photocured P(VDF-TrFE) | 15~18 | 10~12 |
| P(VDF-HFP) | 15~18 | 10~12 |
| Photocured P(VDF-HFP) | 11~13 | 7~9 |

The current (I)-voltage (V) response of the MIM structures were measured using a high sensitivity Keithley 4200 semiconductor characterization system. All of the measurements were performed in ambient atmosphere (relative humidity=~10-60%). The triaxial cabling and probing system was employed to minimize electrical noise during the I-V scans. During the measurement, the voltage applied to the bottom ITO contact was scanned from 100 V to −100 V and the top gold contact was grounded to 0 V.

Figure 8:
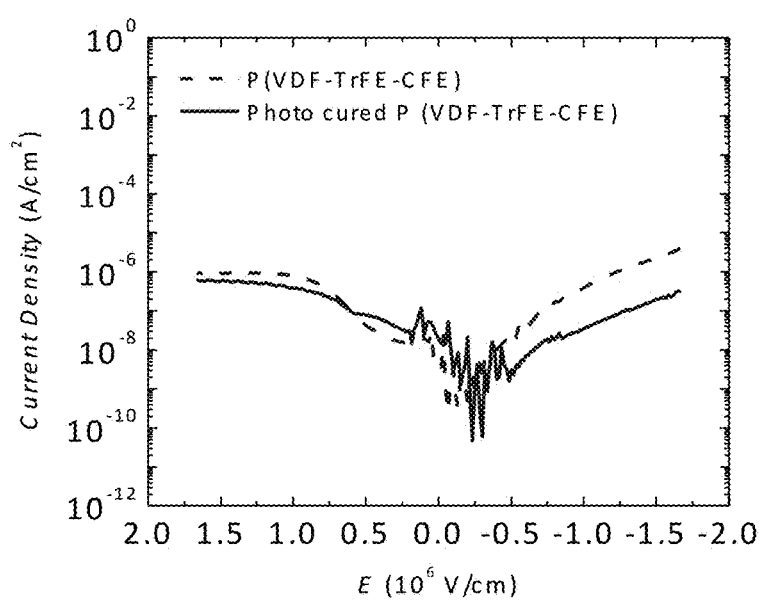
FIG. 8 shows representative leakage current density (J) vs. electrical field (E) characterization for pristine P(VDF-TrFE-CFE) films and photocrosslinked P(VDF-TrFE-CFE) films according to the present teachings.

FIG. 8 compares the leakage current density (J) of the uncured P(VDF-TrFE-CFE) (no additives) with the photocured P(VDF-TrFE-CFE) as the insulating layer. The leakage current density (J) was obtained by normalizing the current (I) by the area of the gold top contact.

Figure 9:
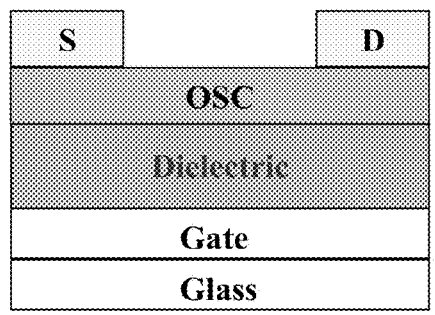
FIG. 9 shows a bottom-gate top-contact thin film transistor structure.

Example 6. Bottom-Gate Top-Contact OFETs with Photocrosslinked P(VDF-TrFE-CFE) Dielectric as the Gate Dielectric FIG. 9 illustrates the structure of a typical bottom-gate top-contact OFET. Photocrosslinked P(VDF-TrFE-CFE) films according to the present teachings (prepared as described in Example 1) were incorporated into bottom-gate top-contact OFETs as the gate dielectric. Specifically, a photocrosslinked P(VDF-TrFE-CFE) film was formed on an ITO substrate (which functions as the gate electrode) as the gate dielectric in bottom-gate top-contact test OFET devices. Comparison devices were made similarly with (a) a ~600 nm pristine P(VDF-TrFE-CFE) film, and (b) a ~600 nm thick poly(methyl methacrylate) (PMMA)-based dielectric film, which has a dielectric constant of ~3.3. 50 nm. The active semiconductor layer comprises C8-BTBT (2,7-dioctyl[1]benzothieno[3,2-b][1] benzothiophene), which was deposited by thermal evaporation in a vacuum chamber. The OFETs were completed by vapor deposition of 50 nm thick gold source and drain contacts through a shadow mask. The channel lengths and widths are 100 μm and 1000 μm, respectively.

Figure 10:
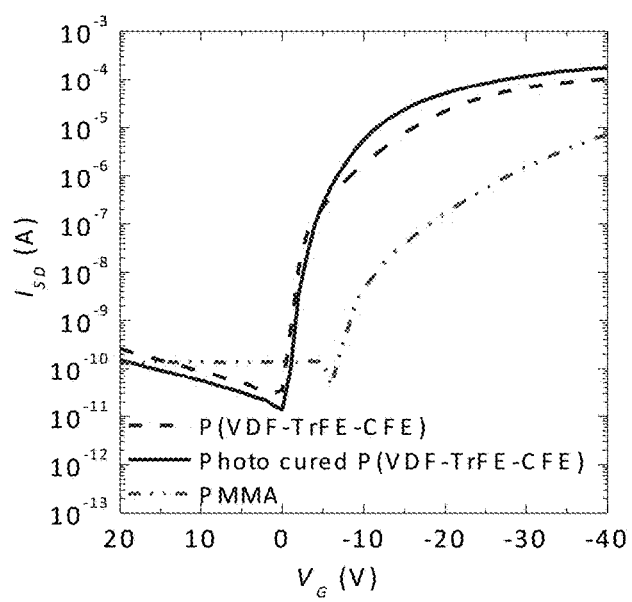
FIG. 10 shows representative transfer curves plots of bottom-gate top-contact OFETs incorporating as the gate dielectric a photocrosslinked P(VDF-TrFE-CFE) film according to the present teachings, a pristine P(VDF-TrFE-CFE) dielectric film, or a PMMA film.

FIG. 10 compares the transfer characteristic curves of the test devices (photocrosslinked P(VDF-TrFE-CFE) dielectric) versus the comparison devices (pristine P(VDF-TrFE-CFE) dielectric, PMMA). Mobilities of ~0.3-0.6 cm$^2$/Vs, and ~1-2 cm$^2$/Vs were obtained for the pristine and photocrosslinked P(VDF-TrFE-CFE) devices, respectively, with turn-on voltages ranging from −2V to 2V, and on-off current ratios of ~10$^6$-10$^7$. In particular, the on-current for both the pristine and photocrosslinked P(VDF-TrFE-CFE) devices was more than one order of magnitude higher than that of the PMMA comparative device.

Figure 11:
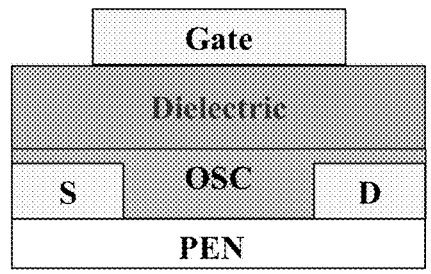
FIG. 11 shows a top-gate bottom-contact thin film transistor structure.

Example 7. Top-Gate Bottom-Contact OFETs with Photocrosslinked P(VDF-TrFE-CFE) Dielectric as the Gate Dielectric FIG. 11 illustrates the structure of a typical top-gate bottom-contact OFET. Photocrosslinked P(VDF-TrFE-CFE) films according to the present teachings (prepared as described in Example 1) were incorporated into top-gate bottom-contact OFETs as the gate dielectric. Specifically, polyethylene naphthalate (PEN) films with a spin-coated surface modifier layer were used as substrates. Source/drain electrodes were defined by thermal evaporation of 50 nm thick silver foil through shadow masks. The channel lengths and widths are 60 μm and 1000 μm, respectively. Prior to deposition of the semiconductor layer, the source/drain electrodes were modified using a thiol treatment process. The active semiconductor layer (~50-100 nm) comprises a molecular cyano-functionalized perylene diimide semiconductor, which was formed by spin-coating then annealing on a 120° C. hot plate for 5 min to remove the solvent residues. A photocrosslinked P(VDF-TrFE-CFE) film (Example 1) was formed on the semiconductor layer as the gate dielectric. The devices were completed by thermally evaporating 50 nm thick gold foil as the gate electrode. Comparative devices were made similarly with (a) a ~600 nm pristine P(VDF-TrFE-CFE) film, and (b) a ~600 nm thick poly(methyl methacrylate) (PMMA)-based dielectric film, which has a dielectric constant of ~3.3. 50 nm.

Figure 12:
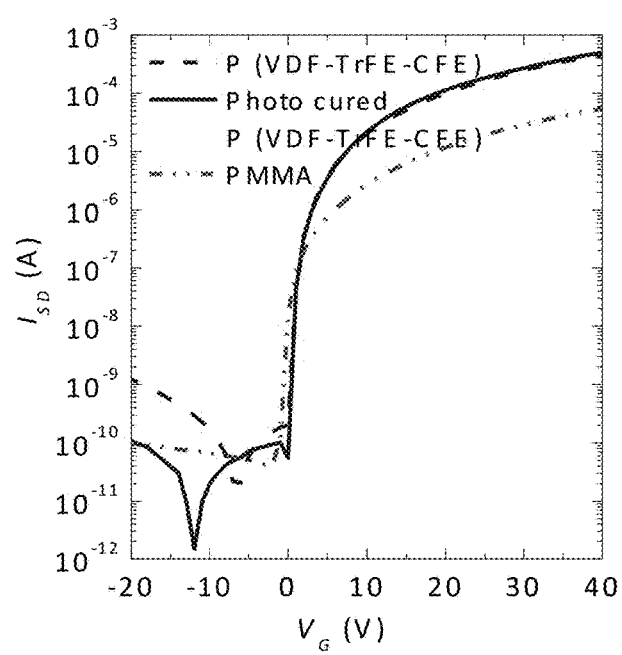
FIG. 12 shows representative transfer curves plots of top-gate bottom-contact OFETs incorporating as the gate dielectric a photocrosslinked P(VDF-TrFE-CFE) film according to the present teachings, a pristine P(VDF-TrFE-CFE) dielectric film, or a PMMA film.

FIG. 12 compares the transfer characteristic curves of the test devices (photocrosslinked P(VDF-TrFE-CFE) dielectric) versus the comparative devices (pristine P(VDF-TrFE-CFE) dielectric, PMMA). Mobilities of ~0.7-0.9 cm$^2$/Vs, and ~0.8-1.4 cm$^2$/Vs were obtained for the pristine and photocrosslinked P(VDF-TrFE-CFE) devices, respectively, with turn-on voltages ranging from −2V to 2V, and on-off current ratios of ~10$^6$-10$^8$. In particular, the on-current for both the pristine and photocrosslinked P(VDF-TrFE-CFE) devices was more than one order of magnitude higher than that of the PMMA comparative device.

Example 8. Capacitance of Bilayer Gate Dielectric

Metal-insulator-metal (MIM) capacitor structures were fabricated with a bilayer dielectric which includes a non-ferroelectric interlayer dielectric (PMMA, k~3.3) in contact with a photocrosslinked P(VDF-TrFE-CFE) dielectric. PMMA was deposited by spin-coating at 2000 r.p.m. for 60 s from an anisole (or PGMEA) solution (20~30 mg/ml), followed by annealing at about 110° C. for 10 min to dry the solvent. The capacitance of the dielectric films was measured. For MIM structure fabrication (FIG. 13a), polycrystalline ITO on glass was used as the bottom electrode onto which the dielectric film was spin-coated to form the insulating layer. To photocrosslink the dielectric film, the spin-coated films were exposed using a Dymax Flood UV lamp (Model 2000-EC) for 2 minutes and were developed by PGMEA. Comparative capacitor structures were fabricated with either a single-layer photocrosslinked P(VDF-TrFE-CFE) dielectric or a single-layer pristine (uncrosslinked) P(VDF-TrFE-CFE) dielectric.

Top square-shaped gold electrodes, of which the feature size ranges from 100 μm×100 μm to 2000 μm×2000 μm, were thermally evaporated in vacuum through shadow masks on top of the dielectric layers to complete the MIM capacitance structures.

Figure 13:
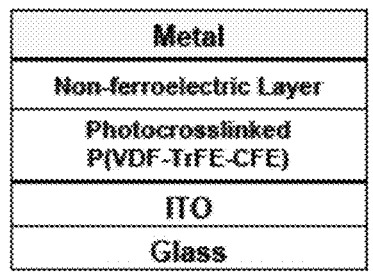
FIG. 13 compares the capacitance of three MIM capacitors that incorporate as the insulator, respectively, a pristine (uncrosslinked) P(VDF-TrFE-CFE) film (~600 nm), a photocrosslinked P(VDF-TrFE-CFE) film (~600 nm), and a bilayer that includes a photocrosslinked P(VDF-TrFE-CFE) film (~600 nm) in contact with a non-ferroelectric polymer thin film (~50 nm): (a) the schematic device structure of the MIM capacitor with the bilayer insulator, (b) representative capacitance-electric field plots of the three capacitors, and (c) leakage capacitance versus electric field of the two capacitors that incorporate as the insulator, respectively, a photocrosslinked P(VDF-TrFE-CFE) film (~600 nm), and a bilayer that includes a photocrosslinked P(VDF-TrFE-CFE) film (~600 nm) in contact with a non-ferroelectric polymer thin film (~50 nm).
Figure 13:
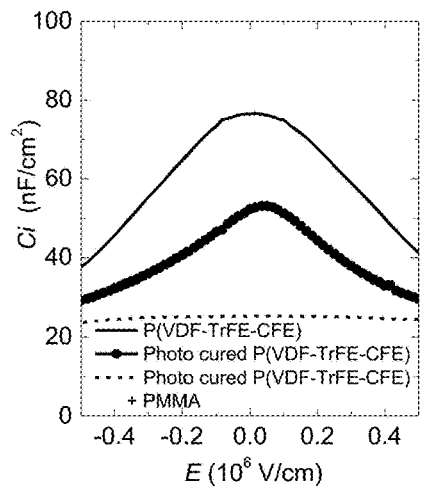
Figure 13:
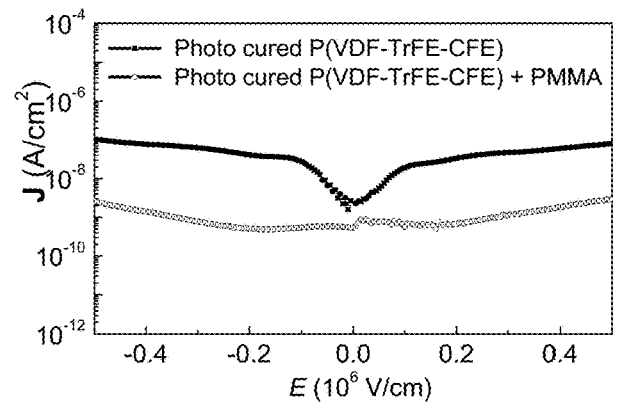

The capacitance-voltage characterization was obtained from measurements taken with a digital precision LCR meter (Agilent model E4980A) operated at AC voltage 0.5V and 1 kHz. FIG. 13b shows representative capacitance of uncrosslinked, photocrosslinked P(VDF-TrFE-CFE) with and without the PMMA as a function of applied DC voltage. The combination of the 50 nm~100 nm PMMA with the high-k dielectric reduced capacitance from 53 nF/cm$^2$ to 25 nF/cm², as suggested by series capacitance model. One distinguished feature is that the capacitance-voltage curve becomes much less voltage dependent for the bilayer dielectric.

The current (I)-voltage (V) response of the MIM structures were measured using a high sensitivity Keithley 4200 semiconductor characterization system. All of the measurements were performed in ambient atmosphere (relative humidity=~10-60%). The triaxial cabling and probing system was employed to minimize electrical noise during the I-V scans. During the measurement, the voltage applied to the bottom ITO contact was scanned from 0 to 30 V or from 0 to −30 V, respectively, and the top gold contact was grounded to 0 V.

FIG. 13c compares the leakage current density (J) of the single-layer photocrosslinked P(VDF-TrFE-CFE) dielectric with that of the bilayer dielectric (P(VDF-TrFE-CFE)+PMMA). The leakage current density (J) was obtained by normalizing the current (I) by the area of the gold top contact. By incorporating a ~50 nm PMMA layer, the capacitance becomes much less voltage dependent, indicating decreased loss factor. Furthermore, the leakage current was reduced by more than an order of magnitude for electric field larger than 0.1 MV/cm, indicating that combining a photocrosslinked P(VDF-TrFE-CFE), and in general a film with residual ferroelectric domains, with a non-ferroelectric layer substantially enhances dielectric strength.

Example 9. Bottom-Gate Top-Contact OFETs with Bilayer Gate Dielectric

Bottom-gate top-contact OFETs were fabricated with (a) a bilayer gate dielectric (photocrosslinked P(VDF-TrFE-CFE)+PMMA) (FIG. 14a) or (b) a single-layer gate dielectric (photocrosslinked P(VDF-TrFE-CFE)). The photocrosslinked P(VDF-TrFE-CFE) film has a thickness of about 600 nm, while the PMMA film has a thickness of about 50 nm. In either case, the gate dielectric was formed on an ITO-coated glass substrate, with ITO as the gate electrode. The active semiconductor layer comprises C8-BTBT (2,7-dioctyl[1]benzothieno[3,2-b][1] benzothiophene), which was deposited by thermal evaporation in a vacuum chamber. The OFETs were completed by vapor deposition of 50 nm thick gold source and drain contacts through a shadow mask. The channel lengths and widths are 100 μm and 1000 μm, respectively.

Figure 14:
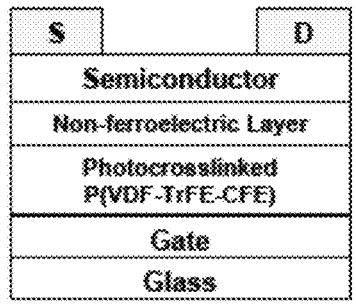
FIG. 14 compares the device performance and stability of bottom-gate top-contact OFETs incorporating as the gate dielectric a single-layer photocrosslinked P(VDF-TrFE-CFE) film (~600 nm), as compared to a bilayer that includes a photocrosslinked P(VDF-TrFE-CFE) film (~600 nm) in contact with a non-ferroelectric polymer thin film (~50 nm): (a) the schematic device structure of the bottom-gate top-contact OFETs with the bilayer gate dielectric, (b) representative transfer curves for both the single-layer dielectric device and the bilayer dielectric device, (c) transfer curve shift under gate bias stress test for the single-layer dielectric device, and (d) transfer curve shift under gate bias stress test for the bilayer dielectric device.
Figure 14:
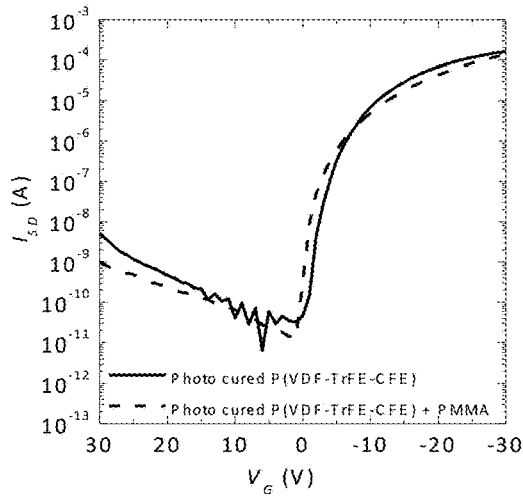
Figure 14:
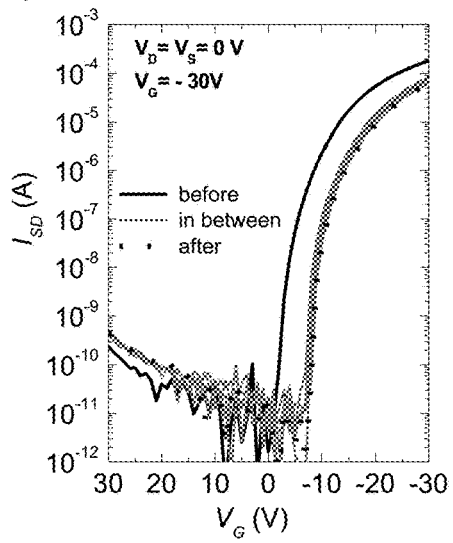
Figure 14:
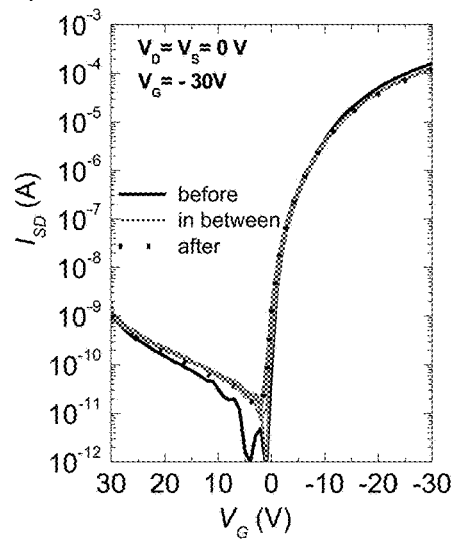

FIG. 14b shows representative transfer curves plot of the two groups of OFETs. Mobilities of 1.5~3.0 cm²/Vs and 1.0~2.0 cm²/Vs, respectively, were obtained for the bilayer dielectric and the single-layer dielectric devices. On-off current ratios of $10^6$~$10^8$ were obtained for both groups of devices.

FIG. 14c (without the PMMA interlayer) and FIG. 14d (with the PMMA interlayer) show the transfer curve shift of the OFETs under gate bias stress test. The bias stress test was performed as follows: (1) an initial transfer curve was performed; (2) right after the measurement, a DC voltage of −30 V was applied to the gate electrodes for 200 s during while keeping both source and drain electrodes at 0 V; (3) an transfer curve was performed at the end of 200 s stress; (4) steps (2) and (3) were subsequently repeated for a total of 7 times. The plot compares the transfer curve before (solid dark), in between (solid light) and after (dotted) the gate stress. The gate bias results in 5 to 10 V late turn-on of the OFET in the absence of the interlayer, the shift was significantly depressed with the use of the bilayer dielectric.

Example 10. Top-Gate Top-Bottom OFETs with Bilayer Gate Dielectric

Top-gate bottom-contact OFETs were fabricated with (a) a bilayer gate dielectric (photocrosslinked P(VDF-TrFE-CFE)+PMMA) (FIG. 15a) or (b) a single-layer gate dielectric (photocrosslinked P(VDF-TrFE-CFE)). Polyethylene naphthalate (PEN) films with a spin-coated surface modifier layer were used as substrates. Source/drain electrodes were defined by thermal evaporation of 50 nm thick silver through shadow masks. The channel length and channel width were 60 μm and 1000 μm, respectively. Prior to deposition of the semiconductor layers, the source/drain electrodes were modified using a thiol treatment process. A PDICN$_2$-based semiconductor layer (50 nm~100 nm) was deposited by spin-coating, followed by annealing on a 120° C. hotplate for 5 min to remove the solvent residues. The interlayer dielectric (~50-100 nm thick) was deposited by spin-coating a photocurable, non-ferroelectric polymer (~20-30 mg/ml in PGMEA, k~3.2), followed by UV curing of 200 mJ/cm² and an annealing step performed at 110 C for 10 min to remove the solvent. Then, a photocrosslinked P(VDF-TrFE-CFE) film (prepared as described in Example 1) was deposited on top of the interlayer dielectric to provide a bilayer gate dielectric. The devices were finished by thermal evaporating 50 nm thick gold as the gate electrodes.

Table 5 summarizes the mobilities and on-off current ratios for the various OFETs tested in Example 9 and Example 10.

TABLE 5

| | Mobility (cm²/Vs) | $I_{on}/I_{off}$ |
|---|---|---|
| BGTC device incorporating single-layer dielectric | 1.0~2.0 | $10^6$~$10^8$ |
| BGTC device incorporating bilayer dielectric | 1.5~3.0 | $10^6$~$10^8$ |
| TGBC device incorporating single-layer dielectric | 0.8~1.4 | $10^6$~$10^7$ |
| TGBC incorporating bilayer dielectric | 0.5~1.2 | $10^7$~$10^8$ |

Figure 15:
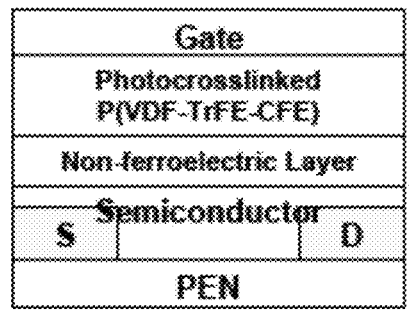
FIG. 15 compares the device performance and stability of top-gate bottom-contact OFETs incorporating as the gate dielectric a single-layer photocrosslinked P(VDF-TrFE-CFE) film (~600 nm), as compared to a bilayer that includes a photocrosslinked P(VDF-TrFE-CFE) film (~600 nm) in contact with a non-ferroelectric polymer thin film (~50 nm): (a) the schematic device structure of the top-gate bottom-contact OFETs with the bilayer gate dielectric, (b) transfer curve shift under gate bias stress test for the single-layer dielectric device, and (c) transfer curve shift under gate bias stress test for the bilayer dielectric device.
Figure 15:
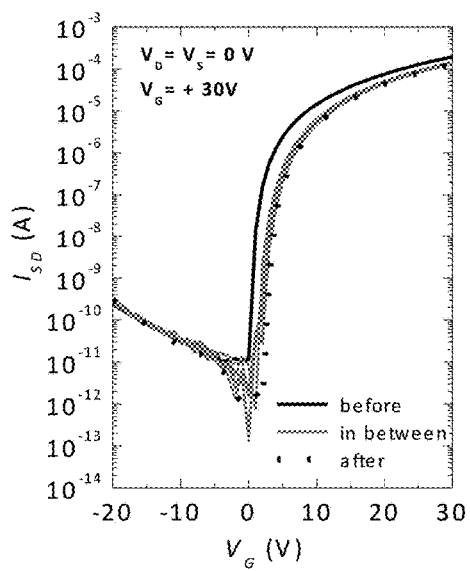
Figure 15:
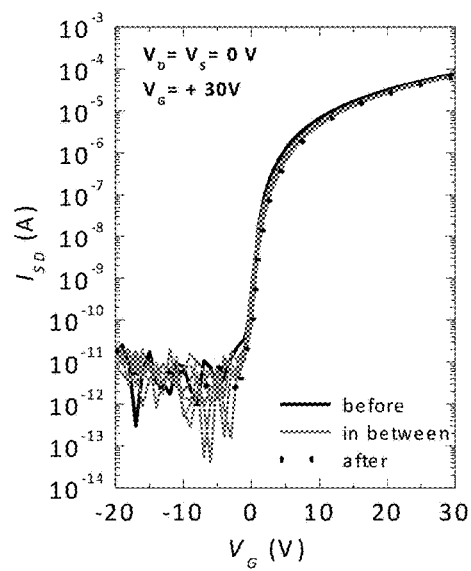

FIG. 15b (without the non-ferroelectric interlayer) and FIG. 15c (with the non-ferroelectric interlayer) show the transfer curve shift of the OFETs under gate bias stress test. The bias stress test was performed as follows: (1) an initial transfer curve was performed; (2) right after the measurement, a DC voltage of −30 V was applied to the gate electrodes for 200 s during while keeping both source and drain electrodes at 0 V; (3) an transfer curve was performed at the end of 200 s stress; (4) steps (2) and (3) were subsequently repeated for a total of 7 times. The plot compares the transfer curve before (solid dark), in between (solid light) and after (dotted) the gate stress. The gate bias results in 3 to 5 V late turn-on of the OFET in the absence of the interlayer, the shift was significantly depressed with the use of the bilayer dielectric.

All publications, patent applications, patents, and other references mentioned herein are incorporated by reference in their entirety. In case of conflict, the present specification, including definitions, controls.

The present teachings can be embodied in other specific forms without departing from the spirit or essential characteristics thereof. The foregoing embodiments are therefore to be considered in all respects illustrative rather than limiting on the present teachings described herein. The scope of the present teachings is thus indicated by the appended claims rather than by the foregoing description, and all changes that come within the meaning and range of equivalency of the claims are intended to be embraced therein.

The invention claimed is:

1. A method of forming a patterned thin film component for use in an electronic, optical, or optoelectronic device, the method comprising:
   depositing onto a substrate a photopatternable composition to provide a thin film;
   exposing the thin film to radiation in an imagewise pattern such that unexposed areas of the thin film are soluble in a developing agent and exposed areas of the thin film become insoluble in the developing agent; and
   removing the unexposed areas of the thin film with the developing agent to provide a patterned thin film component;
   wherein the photopatternable composition comprises a vinylidene fluoride-based polymer, a photosensitive non-nucleophilic base, and a crosslinking agent, wherein:
   the vinylidene fluoride-based polymer comprises a first repeating unit that is vinylidene fluoride, a second repeating unit selected from the group consisting of vinyl fluoride, trifluoroethylene, chlorofluoroethylene, chlorotrifluoroethylene, vinylidene chloride, and hexafluoropropylene;
   the photosensitive non-nucleophilic base is represented by one of the formulae selected from the group consisting of:

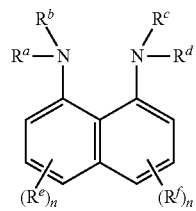
(II)

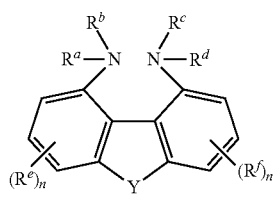
(III)

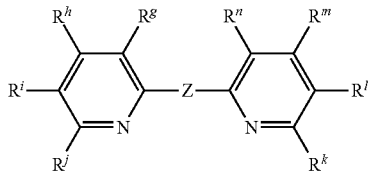
(IV)

wherein
   Y is selected from the group consisting of C=C, CR$_2$, NR, O, S, and Se, wherein R is H, a C$_{1-6}$ alkyl group, an optionally substituted phenyl group, or an optionally substituted benzyl group;
   Z is selected from the group consisting of NR, an optionally substituted pyridyl group, or a covalent bond;

R$^a$, R$^b$, R$^c$, and R$^d$ independently are H, a C$_{1-6}$ alkyl group, an optionally substituted phenyl group, or an optionally substituted benzyl group, or R$^a$ and R$^b$ together and/or R$^c$ and R$^d$ together can be joined with the nitrogen atom to form a guanidinyl group or a triaminophosphazenyl group;
   R$^e$ and R$^f$ independently are a halo group, a cyano group, a nitro group, a C$_{1-6}$ alkyl group, a C$_{1-6}$ haloalkyl group, or a C$_{1-6}$ alkoxy group;
   R$^g$, R$^h$, R$^i$, and R$^j$ independently are H, a halo group, a cyano group, a nitro group, a C$_{1-6}$ alkyl group, a C$_{1-6}$ haloalkyl group, or a C$_{1-6}$ alkoxy group, an optionally substituted phenyl group, or an optionally substituted benzyl group, or R$^g$ and R$^h$ together or R$^h$ and R$^i$ together or R$^i$ and R$^j$ together can be joined with the two carbon atoms therebetween to form an optionally substituted C$_{6-14}$ aryl group or an optionally substituted 5-14 membered heteroaryl group;
   R$^k$, R$^l$, R$^m$ and R$^n$ independently are H, a halo group, a cyano group, a nitro group, a C$_{1-6}$ alkyl group, a C$_{1-6}$ haloalkyl group, or a C$_{1-6}$ alkoxy group, an optionally substituted phenyl group, or an optionally substituted benzyl group, or R$^k$ and R$^l$ together or R$^l$ and R$^m$ together or R$^m$ and R$^n$ together can be joined with the two carbon atoms therebetween to form an optionally substituted C$_{6-14}$ aryl group or an optionally substituted 5-14 membered heteroaryl group; or
   if neither R$^g$ and R$^h$ together nor R$^m$ and R$^n$ together join to form an optionally substituted C$_{6-14}$ aryl group or an optionally substituted 5-14 membered heteroaryl group, then R$^g$ and R$^n$ together can be joined with Q and the four carbon atoms therebetween to form an optionally substituted C$_{6-14}$ aryl group or an optionally substituted 5-14 membered heteroaryl group; and
   n is 0, 1, 2 or 3; and
   the crosslinking agent is not thermally activated and is not peroxide-based.

2. The method of claim 1, wherein the photosensitive non-nucleophilic base is represented by one of the formulae selected from the group consisting of:

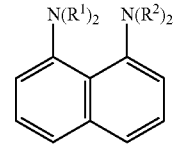
(IIa)

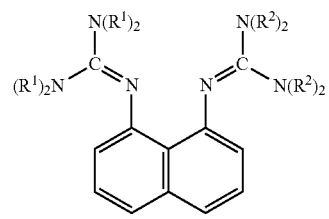
(IIb)

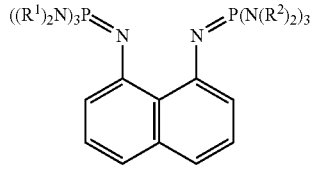
(IIc)

-continued

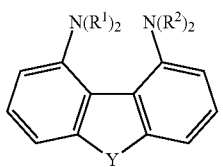
(IIIa)

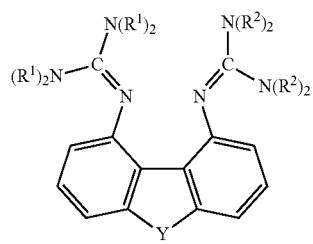
(IIIb)

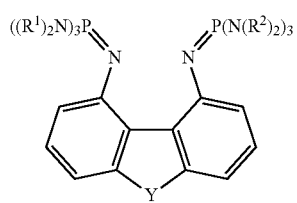
(IIIc)

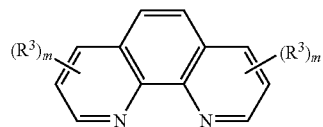
(IVa)

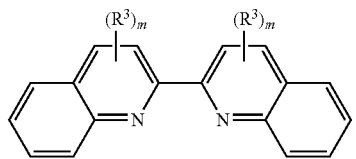
(IVb)

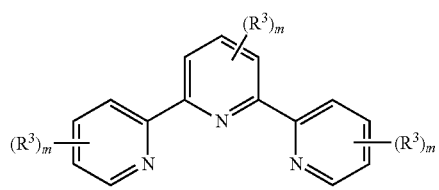
(IVc)

wherein each $R^1$ and $R^2$ independently is H or a $C_{1-6}$ alkyl group; each $R^3$ independently is a $C_{1-6}$ alkyl group or an optionally substituted benzyl group; and m is 0, 1, or 2.

3. The method of claim 1, wherein the photosensitive non-nucleophilic base is selected from the group consisting of:

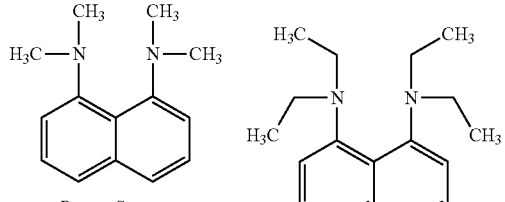

Proton Sponge (PrS)
1,8-bis(dimethyl amino) naphthalene

E-PrS
1,8-bis(diethylamino) naphthalene

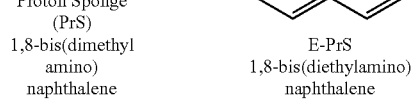

EH-PrS

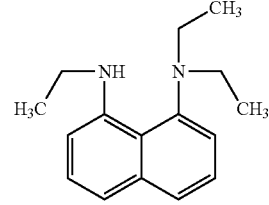

TMPNTL
3,4,7,8-tetramethyl-1,10-phenanthroline

4. The method of claim 1, wherein the vinylidene fluoride-based polymer is a copolymer selected from the group consisting of a copolymer of vinylidene fluoride and trifluoroethylene (P(VDF-TrFE)), a copolymer of vinylidene fluoride and chlorotrifluoroethylene (P(VDF-CTFE)), and a copolymer of vinylidene fluoride and hexafluoropropylene (P(VDF-HFP)), or a terpolymer selected from the group consisting of poly(vinylidene fluoride-trifluoroethylene-chlorotrifluoroethylene), poly(vinylidene fluoride-trifluoroethylene-chlorofluoroethylene), poly(vinylidene fluoride-trifluoroethylene-hexafluoropropylene), poly(vinylidene fluoride-trifluoroethylene-vinyl fluoride), and poly(vinylidene fluoride-trifluoroethylene-vinylidene chloride).

5. The method of claim 1, wherein the vinylidene fluoride-based polymer is represented by formula (I):

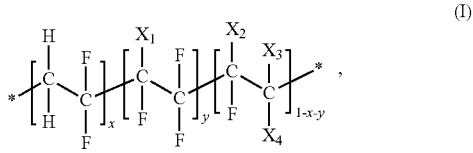
(I)

wherein $X_1$ is H or Cl;
$X_2$, $X_3$, and $X_4$ are selected from the group consisting of H, F and Cl, provided that no more than one of $X_2$, $X_3$, and $X_4$ is Cl and not all of $X_2$, $X_3$, and $X_4$ are F;
x is between about 30 mol % and about 85 mol %;
y is between about 10 mol % and about 65 mol %; and
x+y≤100 mol %.

6. The method of claim 5, wherein x is between about 55 mol % and about 75 mol %, and y is between about 15 mol % and about 35 mol %.

7. The method of claim 1, wherein the crosslinking agent comprises two or more crosslinking groups independently selected from the group consisting of maleimide, amine, thiol, phenol, cinnamate and coumarin groups.

8. The method of claim 1, wherein the crosslinking agent does not absorb in the same wavelengths as the photosensitive non-nucleophilic base.

9. The method of claim 1, wherein the photosensitive non-nucleophilic base and the crosslinking agent individually are present in the composition at less than about 10 wt % of the vinylidene fluoride-based polymer.

10. The method of claim 1, wherein the photopatternable composition comprises an organic solvent selected from the group consisting of ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate (PGMEA), methyl lactate, ethyl lactate, γ-butyrolactone, acetone, acetylacetone, methyl ethyl ketone, methyl isobutyl ketone, 2-butanone, 2-pentanone, 3-pentanone, 2-heptanone, 3-heptanone, cyclopentanone, and cyclohexanone.

11. The method of claim 10, wherein the vinylidene fluoride-based polymer and the organic solvent have a weight-to-volume ratio between about 20 mg/ml and about 100 mg/ml.

12. The method of claim 1 comprising providing an organic thin film adjacent to the patterned thin film component, wherein the organic thin film comprises a non-ferroelectric polymer.

13. The method of claim 12, wherein the non-ferroelectric polymer is selected from the group consisting of perfluoro(1-butenyl vinyl ether) homocyclopolymer polystyrene, polyethylene, poly-alpha-methyl styrene, polyisobutene, polypropylene, polyvinylcyclohexane, and polymethylmethacrylate.

14. The method of claim 1, wherein the electronic, optical, or optoelectronic device is an organic field-effect transistor comprising the patterned thin film component as the gate dielectric, wherein the organic field-effect transistor operates at voltages less than about |40| V.

15. The method of claim 1, wherein the electronic, optical, or optoelectronic device is an organic light-emitting transistor comprising the patterned thin film component as the gate dielectric, wherein the organic light-emitting transistor operates at voltages less than about |40| V.

16. The method of claim 15, wherein the organic light-emitting transistor comprises a trilayer active layer, wherein the trilayer active layer comprises an emissive sublayer disposed between a hole transport sublayer and an electron transport sublayer.

17. An organic thin film transistor comprising a patterned thin film component as the gate dielectric, wherein the patterned thin film component is made by the method of claim 1 and comprises a crosslinked polymer material, the crosslinked polymer material comprising a vinylidene fluoride-based polymer, a non-nucleophilic base, and a crosslinking agent, wherein the vinylidene fluoride-based polymer is crosslinked by the crosslinking agent, and wherein:
the vinylidene fluoride-based polymer comprises a first repeating unit that is vinylidene fluoride, a second repeating unit selected from the group consisting of vinyl fluoride, trifluoroethylene, chlorofluoroethylene, chlorotrifluoroethylene, vinylidene chloride, and hexafluoropropylene;
the photosensitive non-nucleophilic base is represented by one of the formulae selected from the group consisting of:

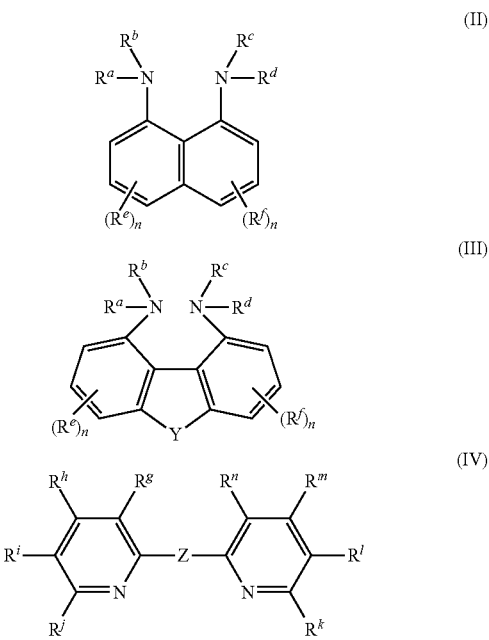

wherein
Y is selected from the group consisting of C=C, $CR_2$, NR, O, S, and Se, wherein R is H, a $C_{1-6}$ alkyl group, an optionally substituted phenyl group, or an optionally substituted benzyl group;
Z is selected from the group consisting of NR, an optionally substituted pyridyl group, or a covalent bond;
$R^a$, $R^b$, $R^c$, and $R^d$ independently are H, a $C_{1-6}$ alkyl group, an optionally substituted phenyl group, or an optionally substituted benzyl group, or $R^a$ and $R^b$ together and/or $R^c$ and $R^d$ together can be joined with the nitrogen atom to form a guanidinyl group or a triaminophosphazenyl group;
$R^e$ and $R^f$ independently are a halo group, a cyano group, a nitro group, a $C_{1-6}$ alkyl group, a $C_{1-6}$ haloalkyl group, or a $C_{1-6}$ alkoxy group;
$R^g$, $R^h$, $R^i$, and $R^j$ independently are H, a halo group, a cyano group, a nitro group, a $C_{1-6}$ alkyl group, a $C_{1-6}$ haloalkyl group, or a $C_{1-6}$ alkoxy group, an optionally substituted phenyl group, or an optionally substituted benzyl group, or $R^g$ and $R^h$ together or $R^h$ and $R^i$ together or $R^i$ and $R^j$ together can be joined with the two carbon atoms therebetween to form an optionally substituted $C_{6-14}$ aryl group or an optionally substituted 5-14 membered heteroaryl group;
$R^k$, $R^l$, $R^m$ and $R^n$ independently are H, a halo group, a cyano group, a nitro group, a $C_{1-6}$ alkyl group, a $C_{1-6}$ haloalkyl group, or a $C_{1-6}$ alkoxy group, an optionally substituted phenyl group, or an optionally substituted benzyl group, or $R^k$ and $R^l$ together or $R^l$ and $R^m$ together or $R^m$ and $R^n$ together can be joined with the two carbon atoms therebetween to form an optionally substituted $C_{6-14}$ aryl group or an optionally substituted 5-14 membered heteroaryl group; or if neither $R^g$ and $R^h$ together nor $R^m$ and $R^n$ together join to form an optionally substituted $C_{6-14}$ aryl group or an optionally substituted 5-14 membered heteroaryl group, then $R^g$ and $R^n$ together can be joined with Q and the four carbon atoms therebetween to form an optionally substituted $C_{6-14}$ aryl group or an optionally substituted 5-14 membered heteroaryl group; and n is 0, 1, 2 or 3; and the crosslinking agent comprises two or more crosslinking groups independently selected from the group consisting of maleimide, amine, thiol, phenol, and cinnamate; and wherein the organic thin film transistor further comprises a substrate, a gate electrode, source and drain electrodes, and an organic semiconductor layer, wherein the gate dielectric is positioned between the gate electrode and the organic semiconductor layer.

18. The organic thin film transistor of claim 17 further comprises an organic thin film comprising a non-ferroelectric polymer adjacent to the patterned thin film component, wherein the organic thin film prevents the vinylidene fluoride-based polymer in the patterned thin film component from forming ferroelectric domains when an electric field is applied to the patterned thin film component, and wherein the organic thin film is positioned between the patterned thin film component and either the organic semiconductor layer or the gate electrode.

19. A display device comprising at least one driving element, wherein the driving element comprises the organic thin film transistor of claim 17.

20. A display device comprising at least one switching element, wherein the switching element comprises the organic thin film transistor of claim 17.

21. The method according to claim 1, wherein the vinylidene fluoride-based polymer further comprises a third repeating unit different from the second repeating unit that is selected from the group consisting of vinyl fluoride, chlorofluoroethylene, chlorotrifluoroethylene, vinylidene chloride, and hexafluoropropylene.

22. The method of claim 1, wherein the crosslinking agent is selected from the group consisting of a bisphenol, a diamine having two amines that can react with the double bonds present in a dehydrohalogenated polymer via hydroamination, a bismaleimide, a multifunctional thiol, and a bis(cinnamate).

23. The method of claim 1, wherein $R^a$, $R^b$, $R^c$, and $R^d$ independently are a $C_{1-6}$ alkyl group, an optionally substituted phenyl group, or an optionally substituted benzyl group, or $R^a$ and $R^b$ together and/or $R^c$ and $R^d$ together can be joined with the nitrogen atom to form a guanidinyl group or a triaminophosphazenyl group.

24. The method of claim 1, wherein $R^a$ and $R^c$ independently are a H, $C_{1-6}$ alkyl group, an optionally substituted phenyl group, or an optionally substituted benzyl group, or $R^a$ and $R^b$ together and/or $R^c$ and $R^d$ together can be joined with the nitrogen atom to form a guanidinyl group or a triaminophosphazenyl group; and $R^b$ and $R^d$ independently are a $C_{1-6}$ alkyl group, an optionally substituted phenyl group, or an optionally substituted benzyl group, or $R^a$ and $R^b$ together and/or $R^c$ and $R^d$ together can be joined with the nitrogen atom to form a guanidinyl group or a triaminophosphazenyl group.

* * * * *